US012622301B2

(12) United States Patent
Yang

(10) Patent No.: US 12,622,301 B2
(45) Date of Patent: May 5, 2026

(54) PACKAGE STRUCTURE AND METHOD FOR MANUFACTURING THE SAME

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 667 days.

(21) Appl. No.: 18/071,797

(22) Filed: Nov. 30, 2022

(65) Prior Publication Data

US 2024/0178082 A1 May 30, 2024

(51) Int. Cl.
| | |
|---|---|
| *H01L 23/13* | (2006.01) |
| *H10W 70/05* | (2026.01) |
| *H10W 70/65* | (2026.01) |
| *H10W 70/68* | (2026.01) |
| *H10W 74/10* | (2026.01) |
| *H10W 90/00* | (2026.01) |
| *H10W 72/00* | (2026.01) |
| *H10W 72/30* | (2026.01) |
| *H10W 90/20* | (2026.01) |
| *H10W 90/22* | (2026.01) |

(52) U.S. Cl.
CPC ......... *H10W 70/68* (2026.01); *H10W 70/093* (2026.01); *H10W 70/095* (2026.01); *H10W 70/65* (2026.01); *H10W 70/681* (2026.01); *H10W 74/121* (2026.01); *H10W 90/00* (2026.01); *H10W 90/401* (2026.01); *H10W 90/701* (2026.01); *H10W 72/01* (2026.01); *H10W 72/07352* (2026.01); *H10W 72/07353* (2026.01); *H10W 72/321* (2026.01); *H10W 72/327* (2026.01); *H10W 72/334* (2026.01); *H10W 72/337* (2026.01); *H10W 72/823* (2026.01); *H10W 90/20* (2026.01); *H10W 90/22* (2026.01); *H10W 90/724* (2026.01); *H10W 90/732* (2026.01); *H10W 90/734* (2026.01)

(58) Field of Classification Search
None
See application file for complete search history.

(56) References Cited

U.S. PATENT DOCUMENTS

| | | | |
|---|---|---|---|
| 8,624,366 B2 * | 1/2014 | Tseng | H01L 21/56 257/691 |
| 2008/0017961 A1 * | 1/2008 | Lin | H01L 21/561 438/106 |

* cited by examiner

*Primary Examiner* — Long Pham
(74) *Attorney, Agent, or Firm* — Xuan Zhang

(57) ABSTRACT

A package structure and a method of manufacturing a package structure are provided. The package structure includes a first substrate, a first electronic component, a second substrate and a second electronic component. The first electronic component is disposed over a first through hole of the first substrate. The first electronic component is electrically connected to a first patterned circuit layer of the first substrate through an extending portion of the first patterned circuit layer extending beyond a sidewall of the first through hole. The second electronic component is disposed over a second through hole of the second substrate. The second electronic component is electrically connected to a second patterned circuit layer of the second substrate through an inner extending portion of the second patterned circuit layer extending beyond a sidewall of the second through hole.

10 Claims, 35 Drawing Sheets

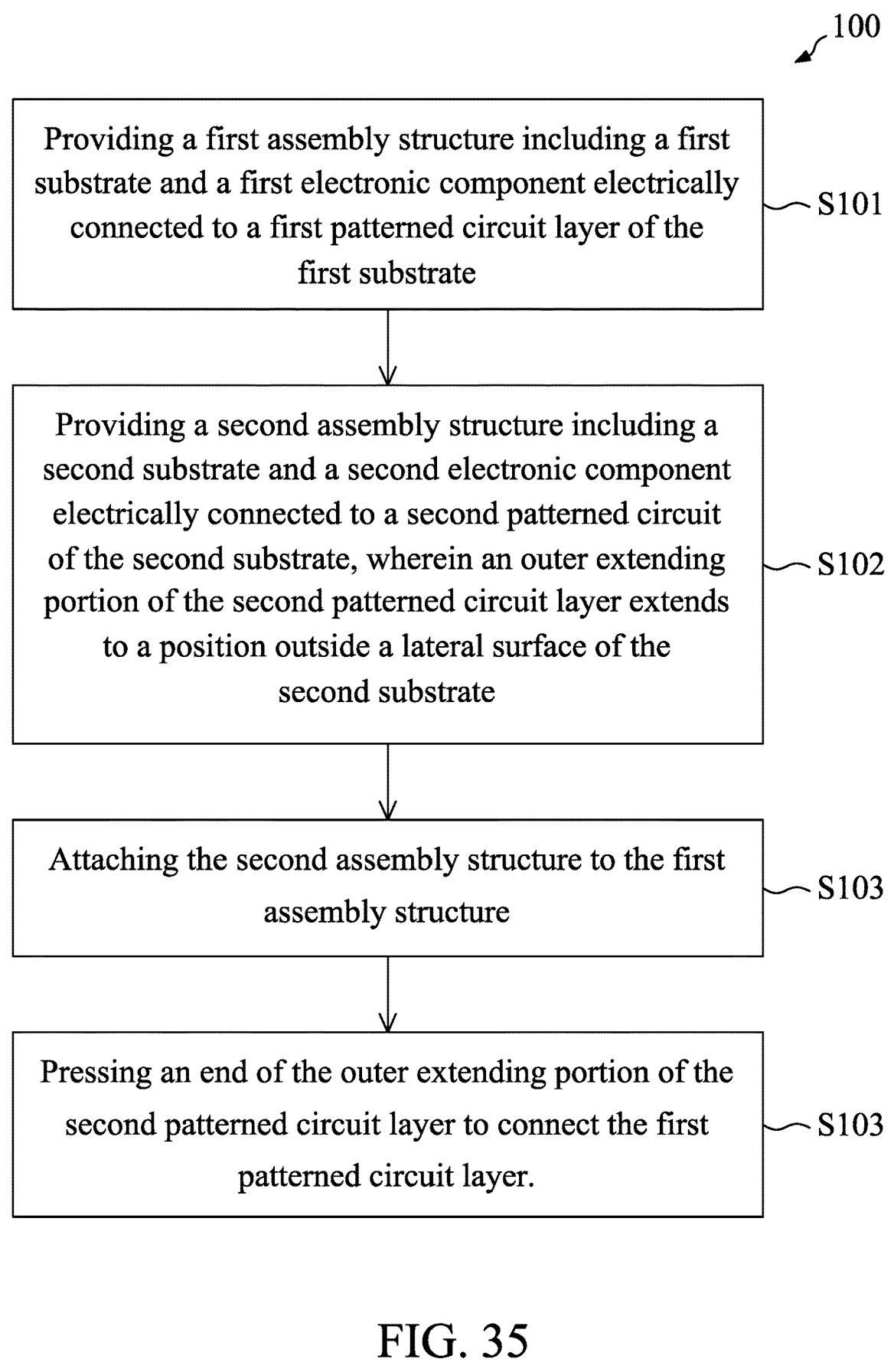

100

```
┌─────────────────────────────────────────────┐
│ Providing a first assembly structure         │
│ including a first substrate and a first      │
│ electronic component electrically        ─── S101
│ connected to a first patterned circuit layer │
│ of the first substrate                       │
└─────────────────────────────────────────────┘
                      │
                      ▼
┌─────────────────────────────────────────────┐
│ Providing a second assembly structure        │
│ including a second substrate and a second    │
│ electronic component electrically connected  │
│ to a second patterned circuit of the second  │
│ substrate, wherein an outer extending    ─── S102
│ portion of the second patterned circuit layer│
│ extends to a position outside a lateral      │
│ surface of the second substrate              │
└─────────────────────────────────────────────┘
                      │
                      ▼
┌─────────────────────────────────────────────┐
│ Attaching the second assembly structure to   │
│ the first assembly structure             ─── S103
└─────────────────────────────────────────────┘
                      │
                      ▼
┌─────────────────────────────────────────────┐
│ Pressing an end of the outer extending       │
│ portion of the second patterned circuit layer│
│ to connect the first patterned circuit   ─── S103
│ layer.                                       │
└─────────────────────────────────────────────┘
```

FIG. 35

PACKAGE STRUCTURE AND METHOD FOR MANUFACTURING THE SAME

TECHNICAL FIELD

The present disclosure relates to a package structure and a method for manufacturing a package structure, and more particularly, to a WBGA package structure.

DISCUSSION OF THE BACKGROUND

In a window ball grid array (WBGA) package, a substrate may define a window over an electronic component. The electronic component may be electrically connected to the substrate through a wire-bonding process. That is, the electrical connection between the electronic component and the substrate may be accomplished by golden bonding wires in the window of the substrate. The advantage of such wire-bonding process is low cost. However, such WBGA package can not transmit high-frequency signals.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a package structure. The package structure includes a first substrate, a first electronic component, a second substrate and a second electronic component. The first substrate includes a first patterned circuit layer and defines a first through hole. The first electronic component is disposed over the first through hole of the first substrate. The first electronic component is electrically connected to the first patterned circuit layer of the first substrate through an extending portion of the first patterned circuit layer extending beyond a sidewall of the first through hole. The second substrate includes a second patterned circuit layer and defines a second through hole. The second electronic component is disposed over the second through hole of the second substrate. The second electronic component is electrically connected to the second patterned circuit layer of the second substrate through an inner extending portion of the second patterned circuit layer extending beyond a sidewall of the second through hole.

Another aspect of the present disclosure provides a package structure. The package structure includes a first substrate, a first electronic component, a second substrate and a second electronic component. The first substrate includes a first patterned circuit layer. The first electronic component is disposed over and electrically connected to the first patterned circuit layer of the first substrate. The second substrate is disposed over the first electronic component, and includes a second patterned circuit layer. The second electronic component is disposed over and electrically connected to the second patterned circuit layer of the second substrate. An outer extending portion of the second patterned circuit layer extends along a lateral surface of the first electronic component.

Another aspect of the present disclosure provides a method of manufacturing a package structure. The method includes: providing a first assembly structure including a first substrate and a first electronic component electrically connected to a first patterned circuit layer of the first substrate; providing a second assembly structure including a second substrate and a second electronic component electrically connected to a second patterned circuit layer of the second substrate, wherein an outer extending portion of the second patterned circuit layer extends to a position outside a lateral surface of the second substrate; attaching the second assembly structure to the first assembly structure; and pressing an end of the outer extending portion of the second patterned circuit layer to connect the first patterned circuit layer.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 35 illustrates a flow chart of a method of manufacturing a package structure in accordance with some embodiments of the present disclosure.

DETAILED DESCRIPTION

Figure 1:
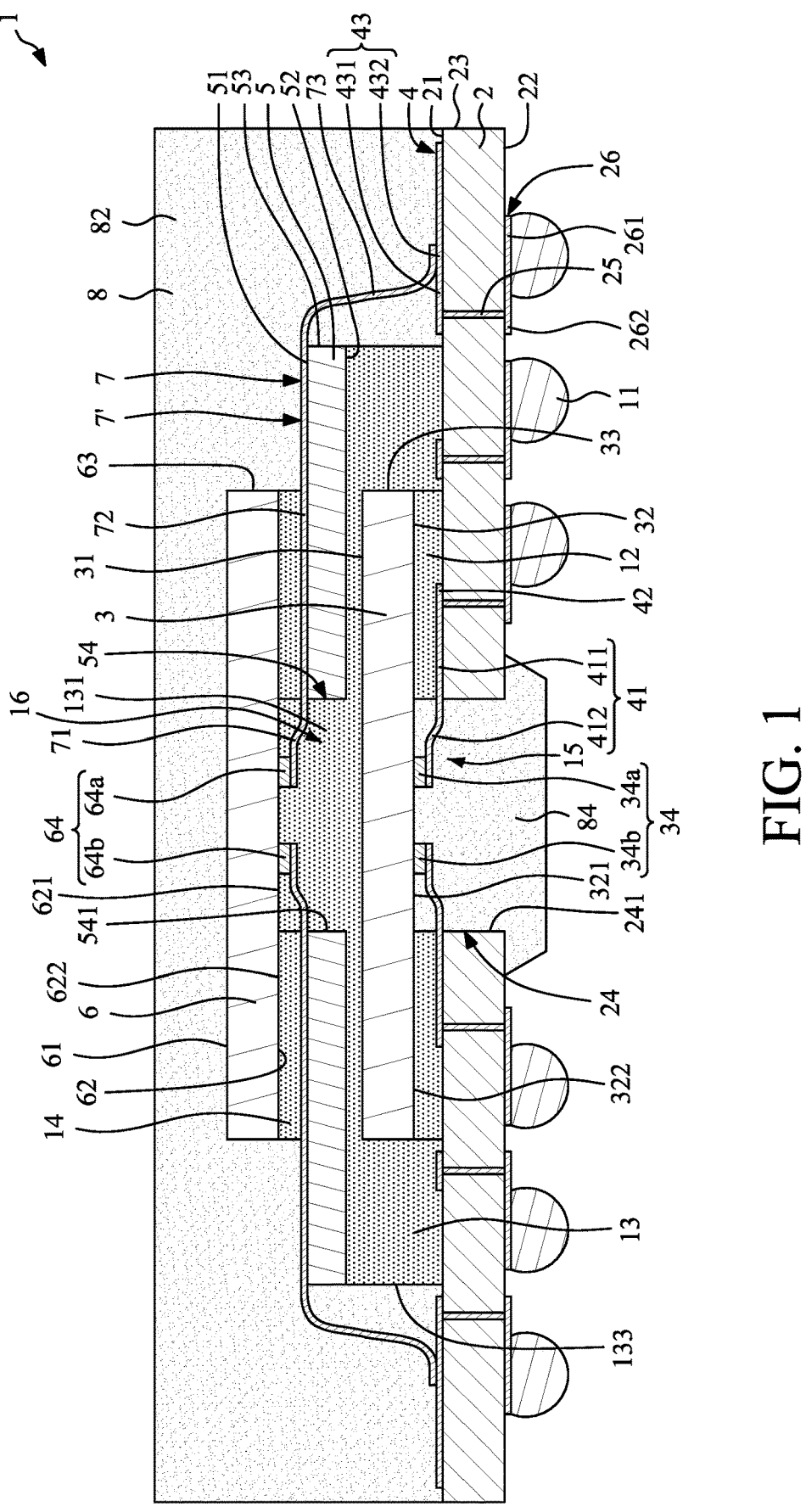
FIG. 1 is a schematic cross-sectional view of a package structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
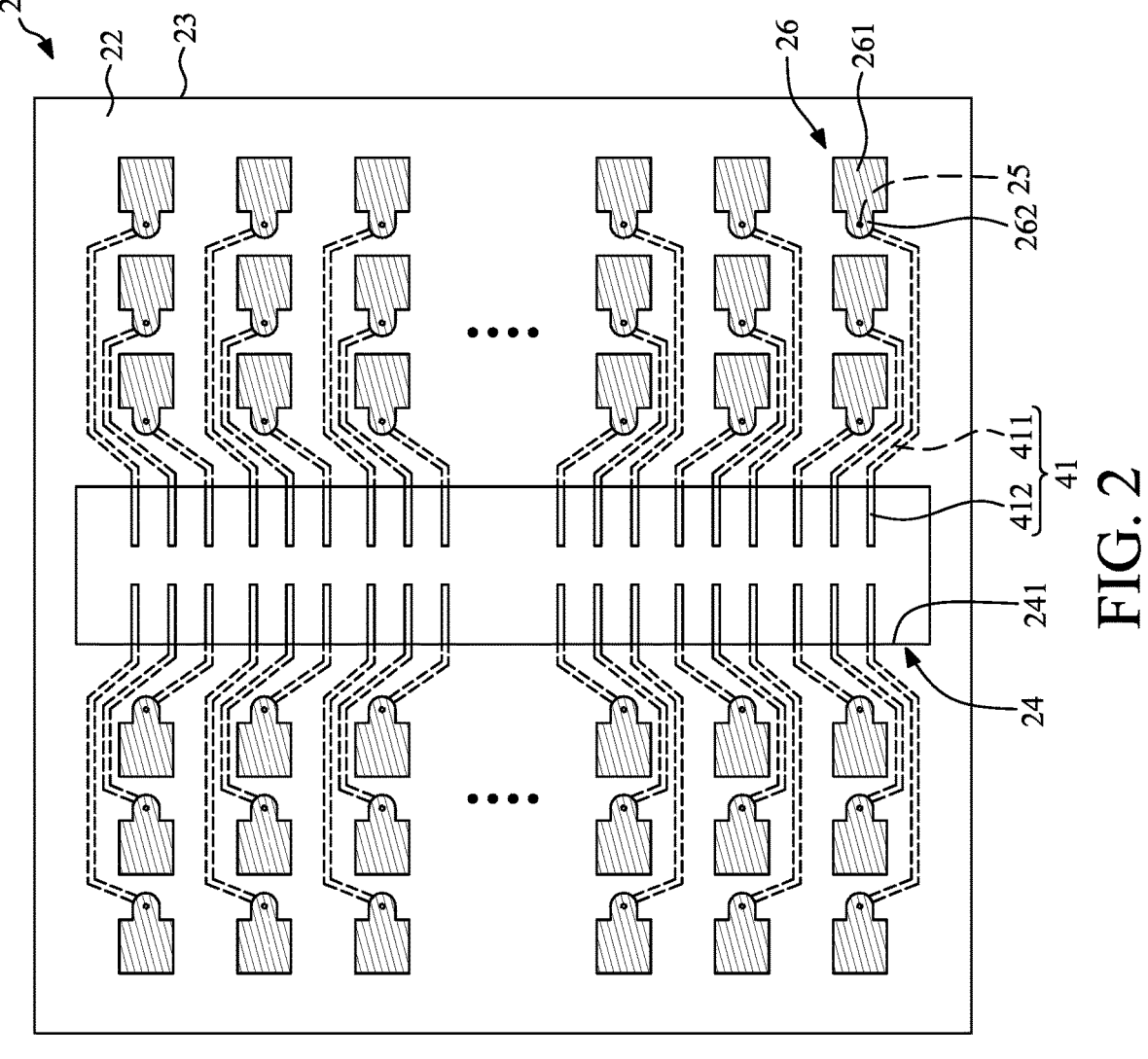
FIG. 2 is a schematic bottom view of the first substrate of the package structure of FIG. 1.
Figure 3:
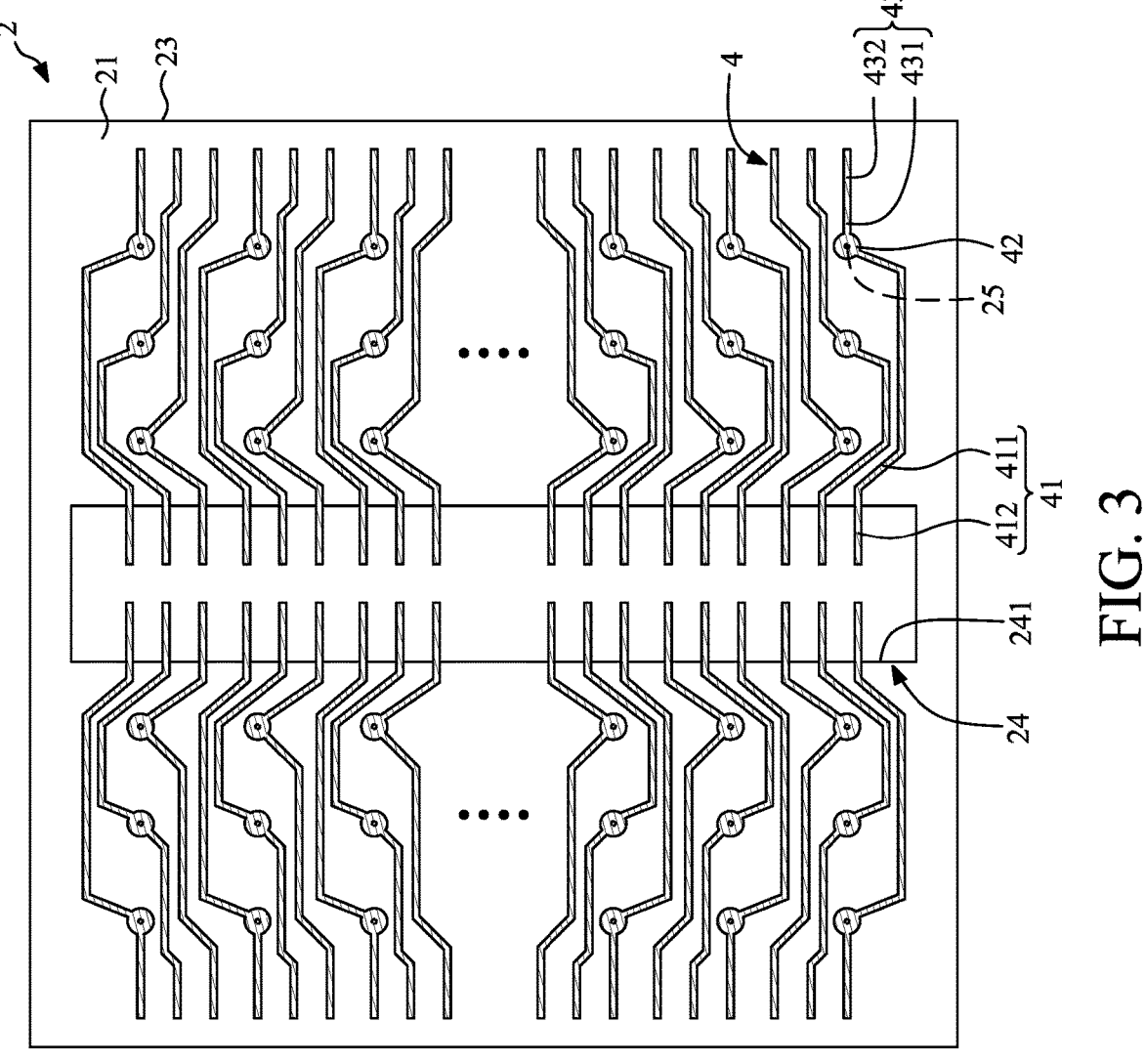
FIG. 3 is a schematic top view of the first substrate of the package structure of FIG. 1.
Figure 4:
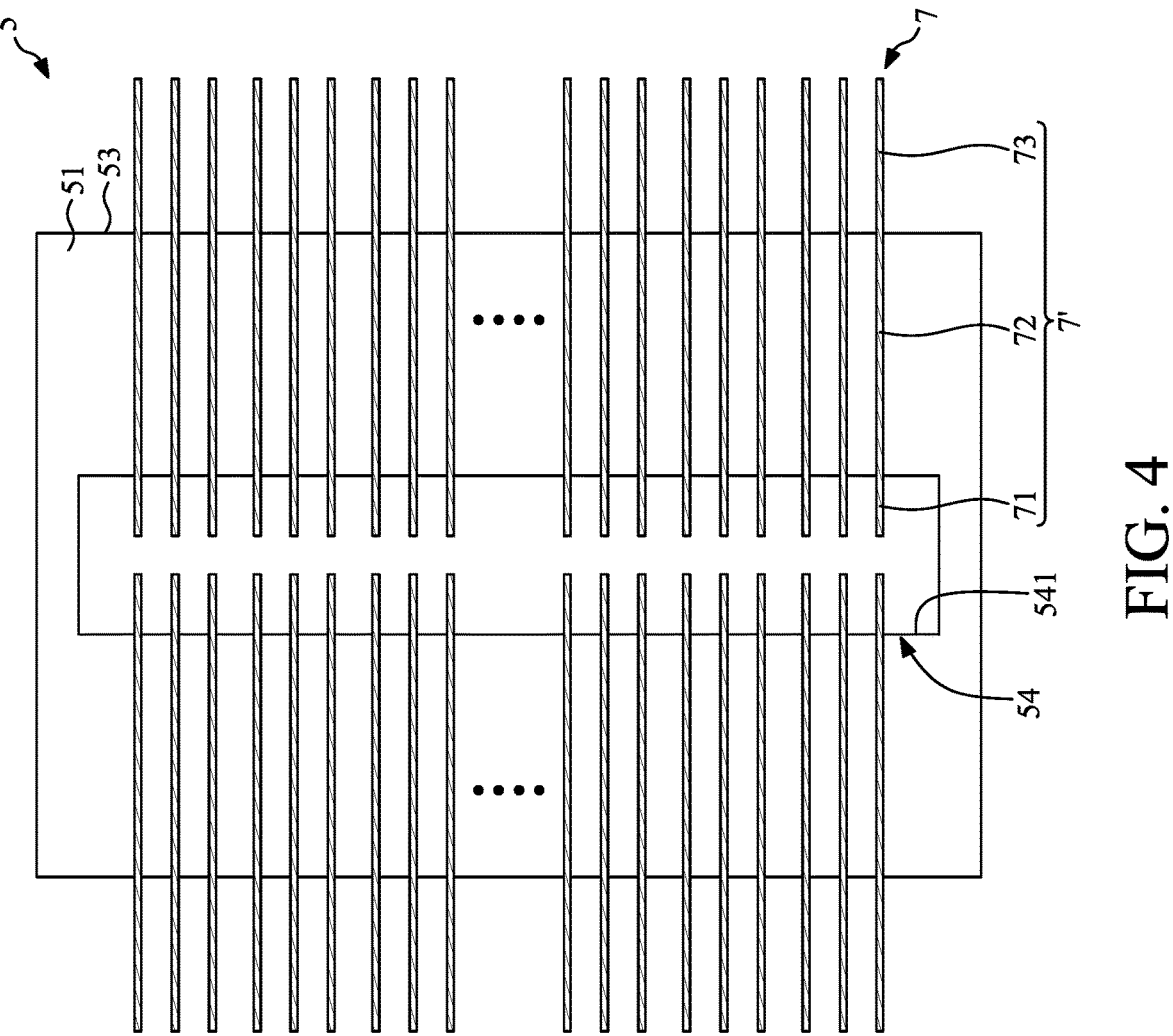
FIG. 4 is a schematic top view of the second substrate of the package structure of FIG. 1.

FIG. 1 is a schematic cross-sectional view of a package structure 1 in accordance with some embodiments of the present disclosure. FIG. 2 is a schematic bottom view of the first substrate 2 of the package structure 1 of FIG. 1. FIG. 3 is a schematic top view of the first substrate 2 of the package structure 1 of FIG. 1. FIG. 4 is a schematic top view of the second substrate 5 of the package structure 1 of FIG. 1.

The package structure 1 may be a window ball grid array (WBGA) package. As shown in FIG. 1, in some embodiments, the package structure 1 may include a first substrate 2, a first electronic component 3, a second substrate 5, a second electronic component 6, a package body 8 and a plurality of external connectors 11.

In some embodiments, the first substrate 2 may include semiconductor materials such as silicon, germanium, gallium, arsenic, and combinations thereof. In some embodiments, the first substrate 2 may include organic material, glass, ceramic material or the like. For example, the first substrate 2 may be made of a cured photoimageable dielectric (PID) material such as epoxy or polyimide (PI) including photoinitiators. For example, the first substrate 2 may include a homogeneous material. For example, the material of the first substrate 2 may include epoxy type FR5, FR4, Bismaleimide triazine (BT), print circuit board (PCB) material, Prepreg (PP), Ajinomoto build-up film (ABF) or other suitable materials.

The first substrate 2 may have a first surface 21 (e.g., a top surface), a second surface 22 (e.g., a bottom surface) and a lateral surface 23. The second surface 22 (e.g., the bottom surface) may be opposite to the first surface 21 (e.g., the top surface). The lateral surface 23 may extend between the first surface 21 (e.g., the top surface) and the second surface 22 (e.g., the bottom surface). The first substrate 2 may define a first through hole 24 extending through the first substrate 2.

Thus, the sidewall 241 of the first through hole 24 may extend between the first surface 21 (e.g., the top surface) and the second surface 22 (e.g., the bottom surface).

The first substrate 2 may include a first patterned circuit layer 4, at least one through via 25 and a bottom pattern 26. The first patterned circuit layer 4 may be disposed adjacent to the first surface 21 (e.g., the top surface) of the first substrate 2. The first patterned circuit layer 4 may be a fan-out circuit layer or a redistribution layer (RDL). The first patterned circuit layer 4 may be disposed on the first surface 21 (e.g., the top surface) of the first substrate 2. Alternatively, the first patterned circuit layer 4 may be disposed on the second surface 22 (e.g., the bottom surface) of the first substrate 2.

The first patterned circuit layer 4 may include a plurality of inner traces 41, a plurality of connecting pads 42 and a plurality of outer traces 43. Each of the inner traces 41 may connect to a respective one of the connecting pads 42 and a respective one of the outer traces 43. A material of the first patterned circuit layer 4 may include copper (Cu), silver (Ag), aluminum (Al), gold (Au), or an alloy thereof. For example, the first patterned circuit layer 4 may be formed or patterned from a metal foil such as a copper foil. Thus, the inner traces 41, the connecting pads 42 and the outer traces 43 may be formed concurrently and integrally through an etching process.

The inner trace 41 may include a main portion 411 and an extending portion 412. The main portion 411 may be connected to the connecting pad 42. The extending portion 412 of the inner trace 41 of the first patterned circuit layer 4 and the first patterned circuit layer 4 may be at the same layer. Alternatively, the extending portion 412 of the inner trace 41 of the first patterned circuit layer 4 and the first patterned circuit layer 4 may be formed integrally. The extending portion 412 may be disposed at a position 15 corresponding to the first through hole 24 of the first substrate 2. For example, the extending portion 412 of the first patterned circuit layer 4 may extend beyond the sidewall 241 of the first through hole 24. As shown in FIG. 1, the extending portion 412 of the first patterned circuit layer 4 may be bent outward from the first through hole 24 and to physically connect and electrically connect the first electronic component 3.

The outer trace 43 may include a main portion 431 and a connecting portion 432. The main portion 431 may be connected to the connecting pad 42. The connecting portion 432 of the outer trace 43 of the first patterned circuit layer 4 and the first patterned circuit layer 4 may be at the same layer. Alternatively, the connecting portion 432 of the outer trace 43 of the first patterned circuit layer 4 and the first patterned circuit layer 4 may be formed integrally. The connecting portion 432 of the outer trace 43 may be disposed at a periphery area of the first substrate 2.

The bottom pattern 26 may be disposed adjacent to or disposed on the second surface 22 (e.g., the bottom surface) of the first substrate 2. The bottom pattern 26 may include a plurality of bonding pads 261 and a plurality of connecting pads 262. Each of the bonding pads 261 may be an input/output (I/O) terminal pad (such as a ball pad). Each of the connecting pads 262 may be connected to a respective one of the bonding pads 261. A material of the bottom pattern 26 may include copper (Cu), silver (Ag), aluminum (Al), gold (Au), or an alloy thereof. For example, the bottom pattern 26 may be formed or patterned from a metal foil such as a copper foil. Thus, the bonding pads 261 and the connecting pads 262 may be formed concurrently and integrally through an etching process.

The through via 25 is disposed in the first substrate 2, and may extend through the first substrate 2. That is, the through via 25 may extend between the first surface 21 (e.g., the top surface) and the second surface 22 (e.g., the bottom surface). Two ends of the through via 25 may be connected to the connecting pad 42 of the first patterned circuit layer 4 and the connecting pad 262 of the bottom pattern 26. Thus, the first patterned circuit layer 4 may be electrically connected to the bottom pattern 26 through the through via 25. In some embodiments, the connecting pad 42 of the first patterned circuit layer 4 and the connecting pad 262 of the bottom pattern 26 may be omitted, and the through via 25 may be connected to the main portion 411 of the inner trace 41 and the main portion 431 of the outer trace 43.

As shown in FIG. 1, there may be an inner (or vertical) electrical connection (or electrical path) within the first substrate 2 due to the through via 25. Thus, there may be an electrical connection between the first surface 21 of the first substrate 2 and the second surface 22 of the first substrate 2.

In some embodiments, the first electronic component 3 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The first electronic component 3 may be disposed over the first surface 21 of the first substrate 2, and may be attached to the first surface 21 of the first substrate 2. The first electronic component 3 may be disposed corresponding to the first through hole 24 of the first substrate 2. The first electronic component 3 may have a first active surface 32 (e.g., a bottom surface), a first backside surface 31 (e.g., a top surface) and a first lateral surface 33. The first active surface 32 (e.g., the bottom surface) may face the first substrate 2. The first backside surface 31 (e.g., the top surface) may be opposite to the first active surface 32 and may face away from the first substrate 2. The first lateral surface 33 may extend between the first active surface 32 and the first backside surface 31.

The first active surface 32 of the first electronic component 3 may have a first portion 321 and a second portion 322. The second portion 322 of the first active surface 32 of the first electronic component 3 may surround the first portion 321 of the first active surface 32 of the first electronic component 3. The first portion 321 of the first active surface 32 of the first electronic component 3 may be disposed over the first through hole 24 of the first substrate 2, and may be exposed in the first through hole 24 of the first substrate 2. The second portion 322 of the first active surface 32 of the first electronic component 3 may be adhered to the first surface 21 of the first substrate 2 through a first adhesion layer 12. In some embodiments, the first adhesion layer 12 may include an adhesive material, such as epoxy, a die attach film (DAF), glue or the like.

The first electronic component 3 may include at least one first bump 34 (or pad) disposed adjacent to the first active surface 32 of the first electronic component 3. For example, the first bump 34 may include a first bump 34a and a first bump 34b. The extending portion 412 of the inner trace 41 of the first patterned circuit layer 4 may be connected to the first bump 34a, 34b of the first electronic component 3. Thus, the first active surface 32 of the first electronic component 3 may be electrically connected to the first patterned circuit layer 4 of the first substrate 2 through the extending portion 412 of the inner trace 41 of the first patterned circuit layer 4 above the first through hole 24. As shown in FIG. 1, the first electronic component 3 may be electrically connected to the first patterned circuit layer 4 solely through the bent portion (e.g., the extending portion 412 of the inner trace 41) of the first patterned circuit layer 4.

In some embodiments, the second substrate 5 may include semiconductor materials such as silicon, germanium, gallium, arsenic, and combinations thereof. In some embodiments, the second substrate may include organic material, glass, ceramic material or the like. For example, the second substrate 5 may be made of a cured photoimageable dielectric (PID) material such as epoxy or polyimide (PI) including photoinitiators. For example, the second substrate 5 may include a homogeneous material. For example, the material of the second substrate 5 may include epoxy type FR5, FR4, Bismaleimide triazine (BT), print circuit board (PCB) material, Prepreg (PP), Ajinomoto build-up film (ABF) or other suitable materials.

The second substrate 5 may have a first surface 51 (e.g., a top surface), a second surface 52 (e.g., a bottom surface) and a lateral surface 53. The second surface 52 (e.g., the bottom surface) may be opposite to the first surface 51 (e.g., the top surface). The lateral surface 53 may extend between the first surface 51 (e.g., the top surface) and the second surface 52 (e.g., the bottom surface). The second substrate may define a second through hole 54 extending through the second substrate 5. Thus, the sidewall 541 of the second through hole 54 may extend between the first surface 51 (e.g., the top surface) and the second surface 52 (e.g., the bottom surface).

The second substrate 5 may include a second patterned circuit layer 7. The second patterned circuit layer 7 may be disposed adjacent to the first surface 51 (e.g., the top surface) of the second substrate 5. The second patterned circuit layer 7 may be a fan-out circuit layer or a redistribution layer (RDL). The second patterned circuit layer 7 may be disposed on the first surface 51 (e.g., the top surface) of the second substrate 5. Alternatively, the second patterned circuit layer 7 may be disposed on the second surface 52 (e.g., the bottom surface) of the second substrate 5.

The second patterned circuit layer 7 may include a plurality of traces 7'. A material of the second patterned circuit layer 7 (or the traces 7') may include copper (Cu), silver (Ag), aluminum (Al), gold (Au), or an alloy thereof. For example, the second patterned circuit layer 7 may be formed or patterned from a metal foil such as a copper foil. Each of the traces 7' may include an inner extending portion 71, a main portion 72 and an outer extending portion 73.

The main portion 72 may connect the inner extending portion 71 and the outer extending portion 73. The inner extending portion 71, the main portion 72 and the outer extending portion 73 may be at the same layer. Alternatively, the traces 7' may be formed integrally. The inner extending portion 71 may be disposed at a position 16 corresponding to the second through hole 54 of the second substrate 5. For example, the inner extending portion 71 of the trace 7' of the second patterned circuit layer 7 may extend beyond the sidewall 541 of the second through hole 54. As shown in FIG. 1, the inner extending portion 71 of the second patterned circuit layer 7 may be bent outward from the second through hole 54 and to physically connect and electrically connect the second electronic component 6.

The outer extending portion 73 of the trace 7' of the second patterned circuit layer 7 may extend beyond the lateral surface 53 of the second substrate 5. In addition, the outer extending portion 73 of the trace 7' of the second patterned circuit layer 7 may be bent downward to physically connect and electrically connect the connecting portion 432 of the outer trace 43 of the first patterned circuit layer 4. Alternatively, the outer extending portion 73 of the second patterned circuit layer 7 may be attached to or bonded to the first patterned circuit layer 4. Thus, the outer extending portion 73 of the trace 7' of the second patterned circuit layer 7 may extend along the lateral surface 53 of the second substrate 5 and/or the first lateral surface 33 of the first electronic component 3.

As shown in FIG. 1, there may be no inner electrical connection (or electrical path) within the second substrate 5. Thus, there may be no electrical connection between the first surface 51 of the second substrate 5 and the second surface 52 of the second substrate 5.

In some embodiments, the second electronic component 6 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The second electronic component 6 may be disposed over the first surface 51 of the second substrate 5, and may be attached to the first surface 51 of the second substrate 5. The second electronic component 6 may be disposed corresponding to the second through hole 54 of the second substrate 5. The second electronic component 6 may have a second active surface 62 (e.g., a bottom surface), a second backside surface 61 (e.g., a top surface) and a second lateral surface 63. The second active surface 62 (e.g., the bottom surface) may face the second substrate 5. The second backside surface 61 (e.g., the top surface) may be opposite to the second active surface 62 and may face away from the second substrate 5. The second lateral surface 63 may extend between the second active surface 62 and the second backside surface 61. As shown in FIG. 1, both the second active surface 62 of the second electronic component 6 and the first active surface 32 of the first electronic component 3 face downward, e.g., face toward the first substrate 2.

The second active surface 62 of the second electronic component 6 may have a first portion 621 and a second portion 622. The second portion 622 of the second active surface 62 of the second electronic component 6 may surround the first portion 621 of the second active surface 62 of the second electronic component 6. The first portion 621 of the second active surface 62 of the second electronic component 6 may be disposed over the second through hole 54 of the second substrate 5, and may be exposed in the second through hole 54 of the second substrate 5. The second portion 622 of the second active surface 62 of the second electronic component 6 may be adhered to the first surface 51 of the second substrate 5 through a second adhesion layer 14. In some embodiments, the second adhesion layer 14 may include an adhesive material, such as epoxy, a die attach film (DAF), glue or the like.

The second electronic component 6 may include at least one second bump 64 (or pad) disposed adjacent to the second active surface 62 of the second electronic component 6. For example, the second bump 64 may include a second bump 64a and a second bump 64b. The inner extending portion 71 of the trace 7' of the second patterned circuit layer 7 may be connected to the second bump 64a, 64b of the second electronic component 6. Thus, the second active surface 62 of the second electronic component 6 may be electrically connected to the second patterned circuit layer 7 of the second substrate 5 through the inner extending portion 71 of the trace 7' of the second patterned circuit layer 7 above the second through hole 54. As shown in FIG. 1, the second electronic component 6 may be electrically connected to the second patterned circuit layer 7 solely through the bent portion (e.g., the inner extending portion 71 of the trace 7') of the second patterned circuit layer 7.

In some embodiments, the second electronic component 6 may be same as or similar to the first electronic component 3. That is, a circuit layout of the second active surface 62 of the second electronic component 6 is same as a circuit layout of the first active surface 32 of the first electronic component 3. For example, the second bump 64a of the second electronic component 6 may be aligned with the first bump 34a of the first electronic component 3, and the electrical function of second bump 64a of the second electronic component 6 may be same as the electrical function of the first bump 34a of the first electronic component 3. Further, the second bump 64b of the second electronic component 6 may be aligned with the first bump 34b of the first electronic component 3, and the electrical function of the second bump 64b of the second electronic component 6 may be same as the electrical function of the first bump 34b of the first electronic component 3. That is, a layout of the first bump(s) 34 (including the first bumps 34a, 34b) of the first electronic component 3 is same as a layout of the second bump(s) 64 (including the second bumps 64a, 64b) of the second electronic component 6.

The second electronic component 6 and the second substrate 5 are attached or adhered to the first substrate 2 and the first electronic component 3 through an intermediate adhesion layer 13. The intermediate adhesion layer 13 may have a lateral surface 133. The outer extending portion 73 of the trace 7' of the second patterned circuit layer 7 may extend along the lateral surface 133 of the intermediate adhesion layer 13. A portion of the intermediate adhesion layer 13 may cover the first lateral surface 33 of the first electronic component 3 and contact the first surface 21 of the first substrate 2. A portion of the intermediate adhesion layer 13 may be disposed between the first backside surface 31 of the first electronic component 3 and the second surface 52 of the second substrate 5. A portion 131 of the intermediate adhesion layer 13 may be disposed in the second through hole 54 of the second substrate 5, and may encapsulate the inner extending portion 71 of the trace 7' of the second patterned circuit layer 7. In addition, the portion 131 of the intermediate adhesion layer 13 may contact the first portion 621 of the second active surface 62 of the second electronic component 6. In some embodiments, a material of the intermediate adhesion layer 13, a material of the first adhesion layer 12 and a material of the second adhesion layer 14 may be the same.

In some embodiments, the package body 8 may include molding material, such as a Novolac-based resin, an epoxy-based resin, a silicone-based resin, or another suitable encapsulant. Suitable fillers may also be included, such as powdered $SiO_2$. The package body 8 may include a first portion 82 and a second portion 84 formed concurrently and integrally. The first portion 82 may be disposed on the first surface 21 of the first substrate 2, and may encapsulate the first electronic component 3, the second substrate 5, the second electronic component 6 and the outer extending portion 73 of the trace 7' of the second patterned circuit layer 7. The second portion 84 may be disposed in the first through hole 24 of the first substrate 2, and may encapsulate the extending portion 412 of the inner trace 41 of the first patterned circuit layer 4. In addition, the second portion 84 of the package body 8 may contact the first portion 321 of the first active surface 32 of the first electronic component 3.

The external connectors 11 may be disposed on the bonding pads 261 of the bottom pattern 26 to provide electrical connections, for example, I/O connections, of the first substrate 2. For example, the external connector 11 may include or may be electrically connected to a ground reference node (GND) node, an electrical power node (VDD) node, a voltage node, or a signal node. In some embodiments, the external connector 11 may include a controlled collapse chip connection (C4) bump, a ball grid array (BGA) or a land grid array (LGA). As shown in FIG. 1, the external connector 11 may be disposed adjacent to the second surface 22 of the first substrate 2, and may be electrically connected to the first patterned circuit layer 4 through the through via 25 in the first substrate 2.

In the embodiment illustrated in FIG. 1, the chip design of the second electronic component 6 may be same as the chip design of the first electronic component 3. Further, both the second active surface 62 of the second electronic component 6 and the first active surface 32 of the first electronic component 3 face downward, e.g., face toward the first substrate 2. Thus, the second electronic component 6 may be stacked on the first electronic component 3 readily due to the first patterned circuit layer 4 and the second patterned circuit layer 7.

In addition, since the extending portion 412 of the inner trace 41 of the first patterned circuit layer 4 and the main portion 411 of the first patterned circuit layer 4 may be at the same layer, there may be no interface therebetween. Since the inner extending portion 71, the main portion 72 and the outer extending portion 73 of the trace 7' of the second patterned circuit layer 7 may be at the same layer, there may be no interface therebetween. Thus, the package structure 1 may be used for transmitting high-frequency signals such as 8000 GHz data rate. In addition, the manufacturing process of the package structure 1 may be simplified, and the manufacturing cost of the package structure 1 may be reduced.

Figure 5:
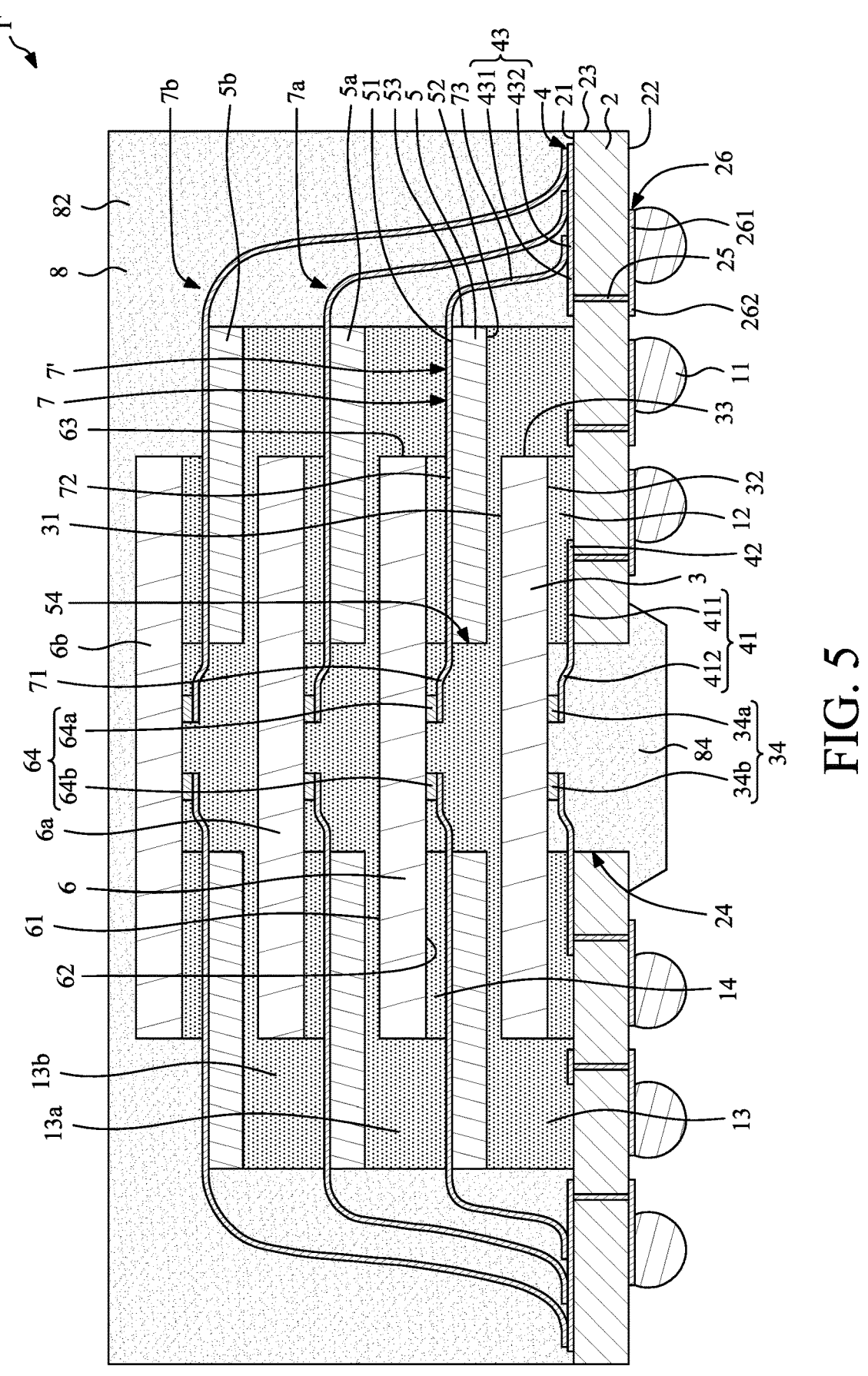
FIG. 5 is a schematic cross-sectional view of a package structure in accordance with some embodiments of the present disclosure.

FIG. 5 is a schematic cross-sectional view of a package structure 1' in accordance with some embodiments of the present disclosure. The package structure 1' may be similar to the package structure 1 of FIG. 1, except that a third substrate 5a, a third electronic component 6a, a fourth substrate 5b and a fourth electronic component 6b are further included.

The third substrate 5a may be same as or similar to the second substrate 5. The third substrate 5a may have a first surface (e.g., a top surface), a second surface (e.g., a bottom surface) and a lateral surface. The second surface (e.g., the bottom surface) may be opposite to the first surface (e.g., the top surface). The lateral surface may extend between the first surface (e.g., the top surface) and the second surface (e.g., the bottom surface). The third substrate 5a may define a third through hole extending through the third substrate 5a.

The third substrate 5a may include a third patterned circuit layer 7a. The third patterned circuit layer 7a may be same as or similar to the second patterned circuit layer 7. The third patterned circuit layer 7a may be disposed adjacent to or disposed on the first surface (e.g., the top surface) of the third substrate 5a.

The third patterned circuit layer 7a may include a plurality of traces. Each of the traces may include an inner extending portion, a main portion and an outer extending portion. The inner extending portion of the trace of the third patterned circuit layer 7a may extend beyond the sidewall of the third through hole. As shown in FIG. 5, the inner extending portion of the third patterned circuit layer 7a may be bent outward from the third through hole and to physically connect and electrically connect the third electronic component 6a. The outer extending portion of the trace of the third patterned circuit layer 7a may be bent downward to physically connect and electrically connect the connecting portion 432 of the outer trace 43 of the first patterned circuit layer 4. Thus, the outer extending portion of the trace of the third patterned circuit layer 7a may extend along the lateral surface of the third substrate 5a, the second lateral surface 63 of the second electronic component 6, the lateral surface 53 of the second substrate 5 and the first lateral surface 33 of the first electronic component 3. In addition, there may be no inner electrical connection (or electrical path) within the third substrate 5a.

The third electronic component 6a may be same as or similar to the second electronic component 6. The third electronic component 6a may be disposed over the first surface of the third substrate 5a, and may be attached to the first surface of the third substrate 5a through an adhesion layer. The third electronic component 6a may be disposed corresponding to the third through hole of the third substrate 5a. The third electronic component 6a may have a third active surface (e.g., a bottom surface), a third backside surface (e.g., a top surface) and a third lateral surface. The third active surface (e.g., the bottom surface) may face the third substrate 5a. The third electronic component 6a may include at least one third bump (or pad) disposed adjacent to the third active surface of the third electronic component 6a. The inner extending portion of the trace of the third patterned circuit layer 7a may be connected to the third bump of the third electronic component 6a.

The third electronic component 6a and the third substrate 5a are attached or adhered to the second substrate 5 and the second electronic component 6 through an adhesion layer 13a. The adhesion layer 13a may be same as or similar to the intermediate adhesion layer 13.

The fourth substrate 5b may be same as or similar to the third substrate 5a. The fourth substrate 5b may include a fourth patterned circuit layer 7b. The fourth patterned circuit layer 7b may be same as or similar to the third patterned circuit layer 7a. The fourth patterned circuit layer 7b may be disposed adjacent to or disposed on the first surface (e.g., the top surface) of the fourth substrate 5b. The inner extending portion of the fourth patterned circuit layer 7b may be bent outward from the fourth through hole of the fourth substrate 5b and to physically connect and electrically connect the fourth electronic component 6b. The outer extending portion of the trace of the fourth patterned circuit layer 7b may be bent downward to physically connect and electrically connect the connecting portion 432 of the outer trace 43 of the first patterned circuit layer 4.

The fourth electronic component 6b may be same as or similar to the third electronic component 6a. The fourth electronic component 6b may be disposed over the first surface of the fourth substrate 5b, and may be attached to the first surface of the fourth substrate 5b through an adhesion layer. The inner extending portion of the trace of the fourth patterned circuit layer 7b may be connected to the bump of the fourth electronic component 6b. The fourth electronic component 6b and the fourth substrate 5b are attached or adhered to the third substrate 5a and the third electronic component 6a through an adhesion layer 13b. The adhesion layer 13b may be same as or similar to the intermediate adhesion layer 13.

FIG. 6 to FIG. 34 illustrate stages of a method of manufacturing a package structure in accordance with some embodiments of the present disclosure. At least some of these figures have been simplified for a better understanding of the aspects of the present disclosure. In some embodiments, the package structure 1 in FIG. 1 may be manufactured by the operations described below with respect to FIG. 6 to FIG. 34.

Referring to FIGS. 6 to 18, a first assembly structure 1a may be provided. The first assembly structure 1a may be formed as following stages.

Figure 6:
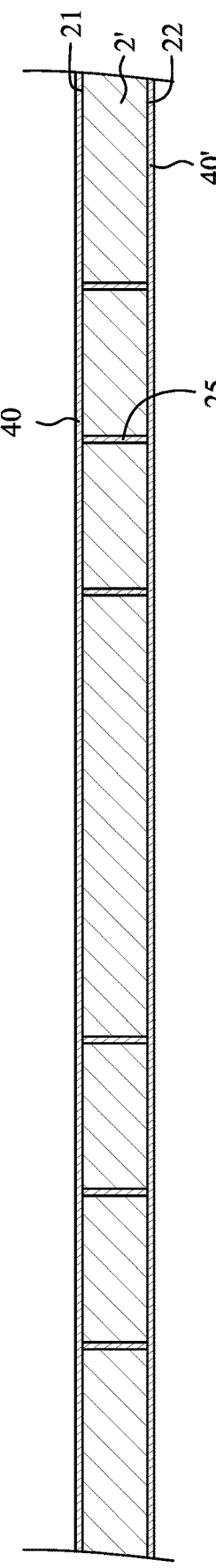
FIG. 6 illustrates one or more stages of a method of manufacturing a package structure in accordance with some embodiments of the present disclosure.

Referring to FIG. 6, a first substrate 2' may be provided. The first substrate 2' may include semiconductor materials such as silicon, germanium, gallium, arsenic, and combinations thereof. In some embodiments, the first substrate 2' may include organic material, glass, ceramic material or the like. For example, the first substrate 2' may be made of a cured photoimageable dielectric (PID) material such as epoxy or polyimide (PI) including photoinitiators. For example, the first substrate 2' may include a homogeneous material. For example, the material of the first substrate 2' may include epoxy type FR5, FR4, Bismaleimide triazine (BT), print circuit board (PCB) material, Prepreg (PP), Ajinomoto build-up film (ABF) or other suitable materials.

The first substrate 2' may have a first surface 21 (e.g., a top surface) and a second surface 22 (e.g., a bottom surface). The second surface 22 (e.g., the bottom surface) may be opposite to the first surface 21 (e.g., the top surface). The first substrate 2' may include a first metal foil 40 and a second metal foil 40'. The first metal foil 40 such as a copper foil may be disposed on or adhered to the first surface 21 (e.g., a top surface) of the first substrate 2'. The second metal foil 40' such as a copper foil may be disposed on or adhered to the second surface 22 (e.g., a bottom surface) of the first substrate 2'. Thus, the first substrate 2' may be a double-sided substrate or a double-sided copper-clad substrate or a double-sided copper foil substrate. The first substrate 2' may at least one through via 25 extending through the first substrate 2'. Two ends of the through via 25 may be connected to the first metal foil and the second metal foil 40'.

Figure 7:
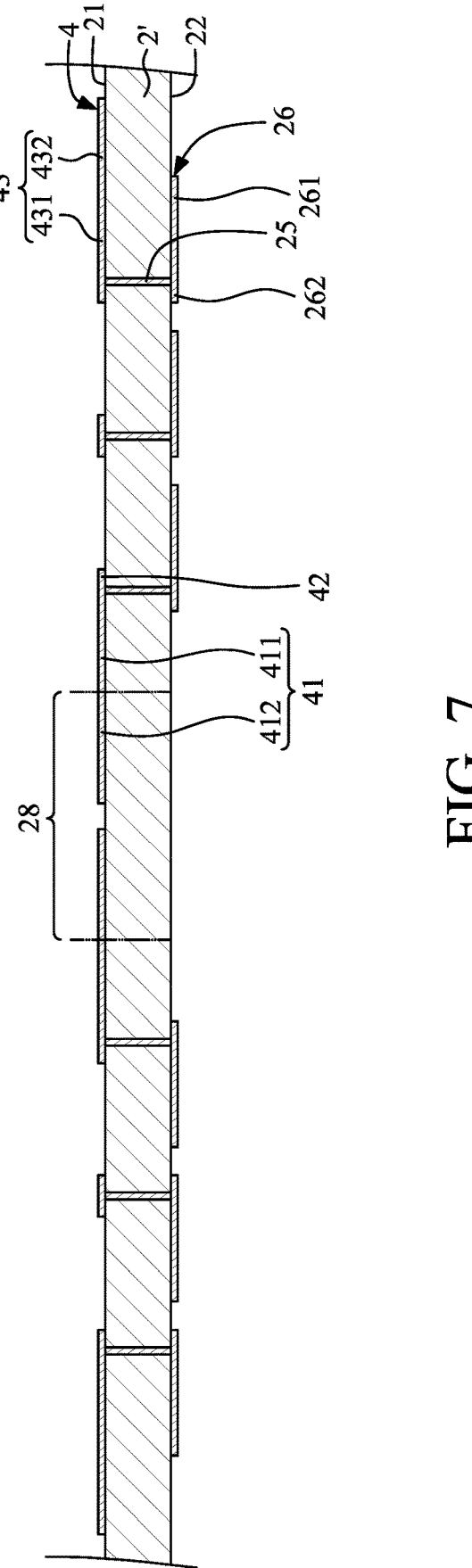
FIG. 7 illustrates one or more stages of a method of manufacturing a package structure in accordance with some embodiments of the present disclosure.
Figure 8:
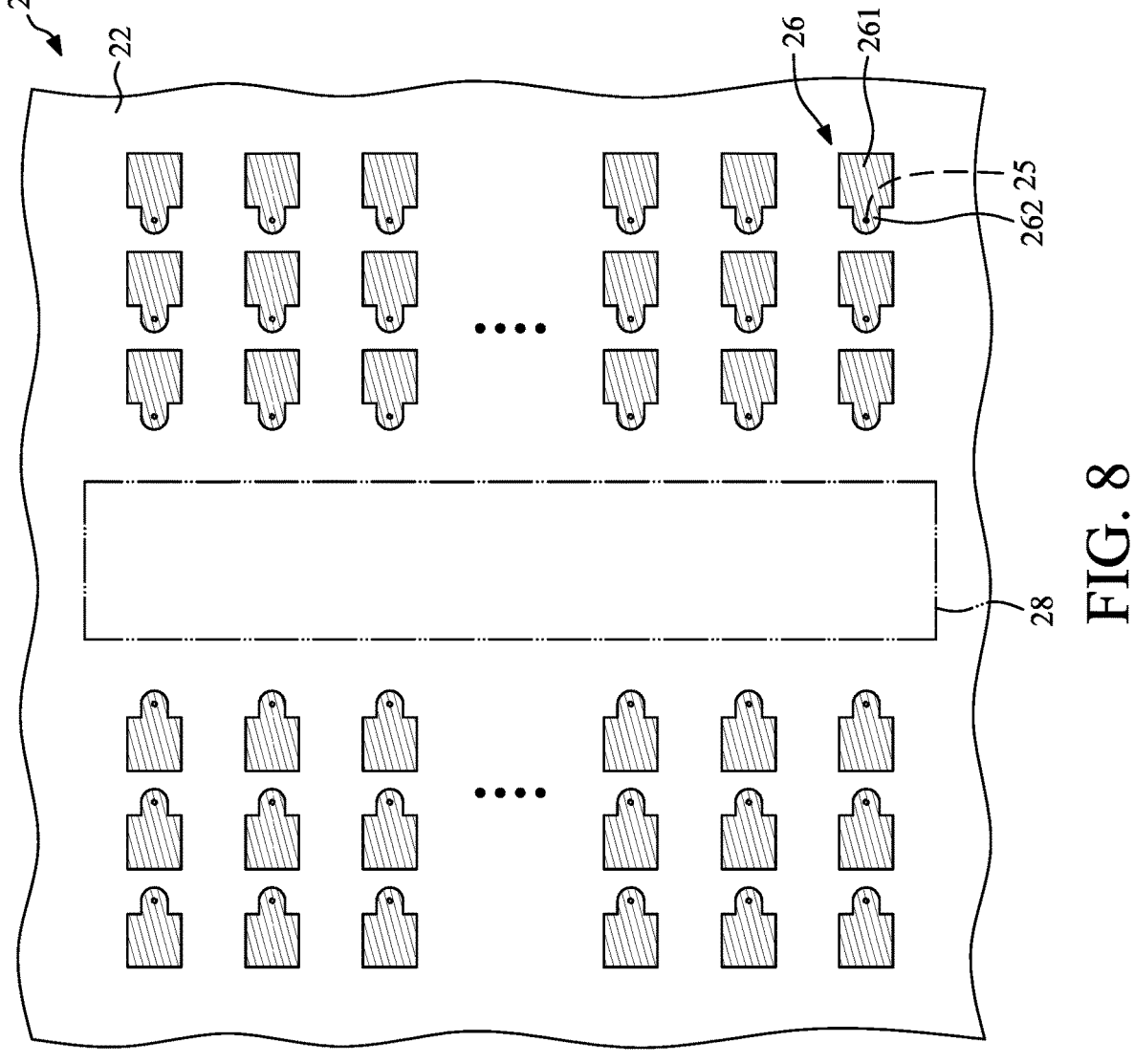
FIG. 8 illustrates a bottom view of FIG. 7.
Figure 9:
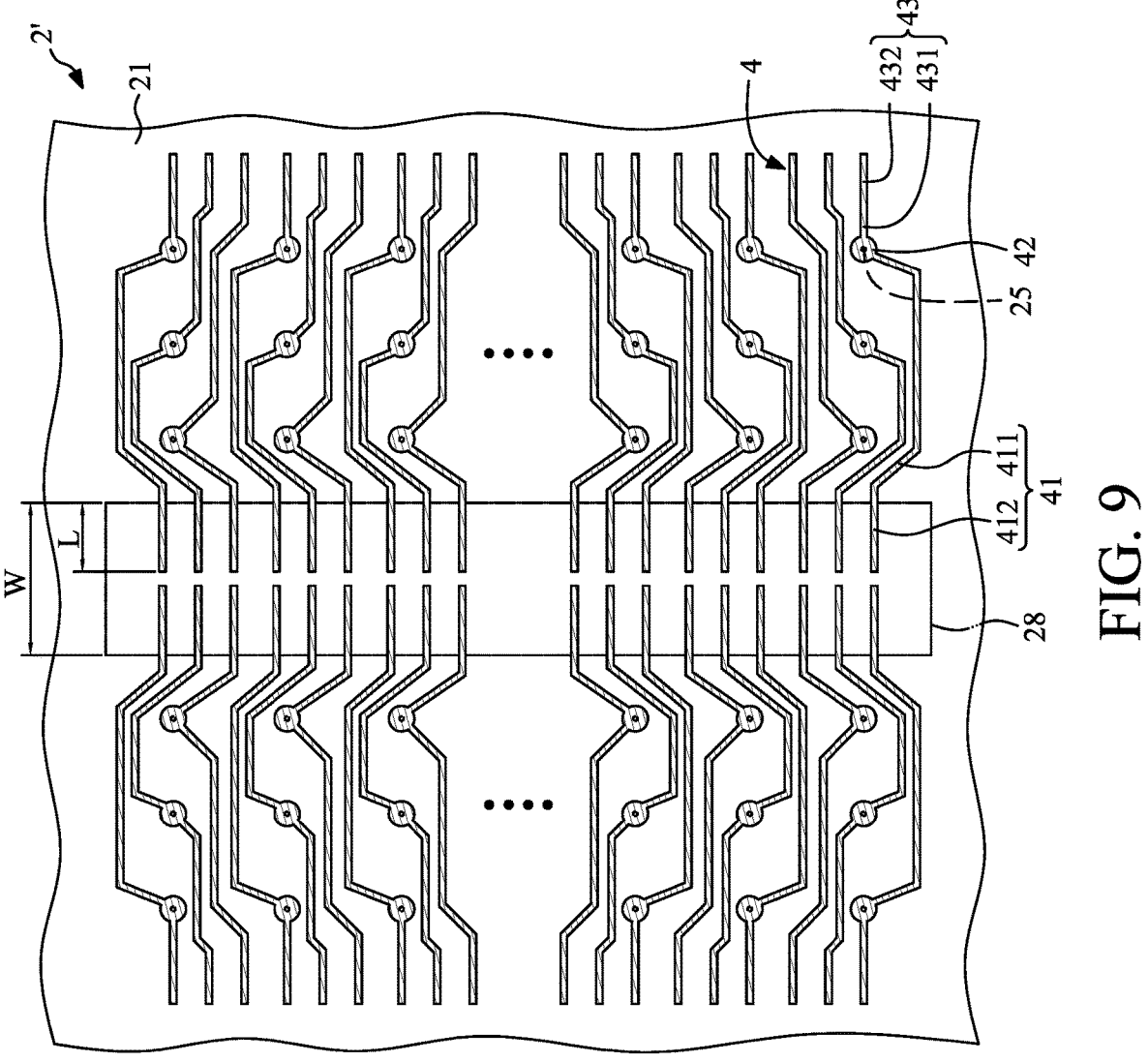
FIG. 9 illustrates a top view of FIG. 7.

Referring to FIGS. 7, 8 and FIG. 9, wherein FIG. 8 illustrates a bottom view of FIG. 7, FIG. 9 illustrates a top view of FIG. 7, the first metal foil 40 and the second metal foil 40' may be patterned to form a first patterned circuit layer 4 and a bottom pattern 26, respectively. The patterning process may include: disposing a patterned mask on the first metal foil 40 and the second metal foil 40', and then etching portions of the first metal foil 40 and the second metal foil 40' that are exposed from the patterned mask. Thus, the first patterned circuit layer 4 and the bottom pattern 26 may be formed by etching rather than plating. The manufacturing cost of such patterning process may be reduced.

The first substrate 2' may have a predetermined area 28 corresponding to the first through hole 24 of FIG. 1. The first patterned circuit layer 4 may be a fan-out circuit layer or a redistribution layer (RDL). The first patterned circuit layer 4 may be disposed on the first surface 21 (e.g., the top surface) of the first substrate 2'.

As shown in FIG. 9, the first patterned circuit layer 4 may include a plurality of inner traces 41, a plurality of connecting pads 42 and a plurality of outer traces 43. Each of the inner traces 41 may connect to a respective one of the connecting pads 42 and a respective one of the outer traces 43. The inner traces 41, the connecting pads 42 and the outer traces 43 may be formed concurrently and integrally through the etching stage of the patterning process. The inner trace 41 may include a main portion 411 and an extending portion 412. The main portion 411 may be connected to the connecting pad 42. The extending portion 412 may be disposed in the predetermined area 28 of the first substrate 2'. A length L of the extending portion 412 of the inner trace 41 of the first patterned circuit layer 4 may be greater than one half of a width W of the predetermined area 28 of the first substrate 2'. The outer trace 43 may include a main portion 431 and a connecting portion 432. The main portion 431 may connect the connecting pad 42 and the connecting portion 432.

As shown in FIG. 8, the bottom pattern 26 may be disposed adjacent to or disposed on the second surface 22 (e.g., the bottom surface) of the first substrate 2'. The bottom pattern 26 may include a plurality of bonding pads 261 and a plurality of connecting pads 262. Each of the bonding pads 261 may be an input/output (I/O) terminal pad (such as a ball pad). Each of the connecting pads 262 may be connected to a respective one of the bonding pads 261. The bonding pads 261 and the connecting pads 262 may be formed concurrently and integrally through the etching stage of the patterning process.

Two ends of the through via 25 may be connected to the connecting pad 42 of the first patterned circuit layer 4 and the connecting pad 262 of the bottom pattern 26. Thus, the first patterned circuit layer 4 may be electrically connected to the bottom pattern 26 through the through via 25. In some embodiments, the connecting pad 42 of the first patterned circuit layer 4 and the connecting pad 262 of the bottom pattern 26 may be omitted, and the through via 25 may be connected to the main portion 411 of the inner trace 41 and the main portion 431 of the outer trace 43.

Figure 10:
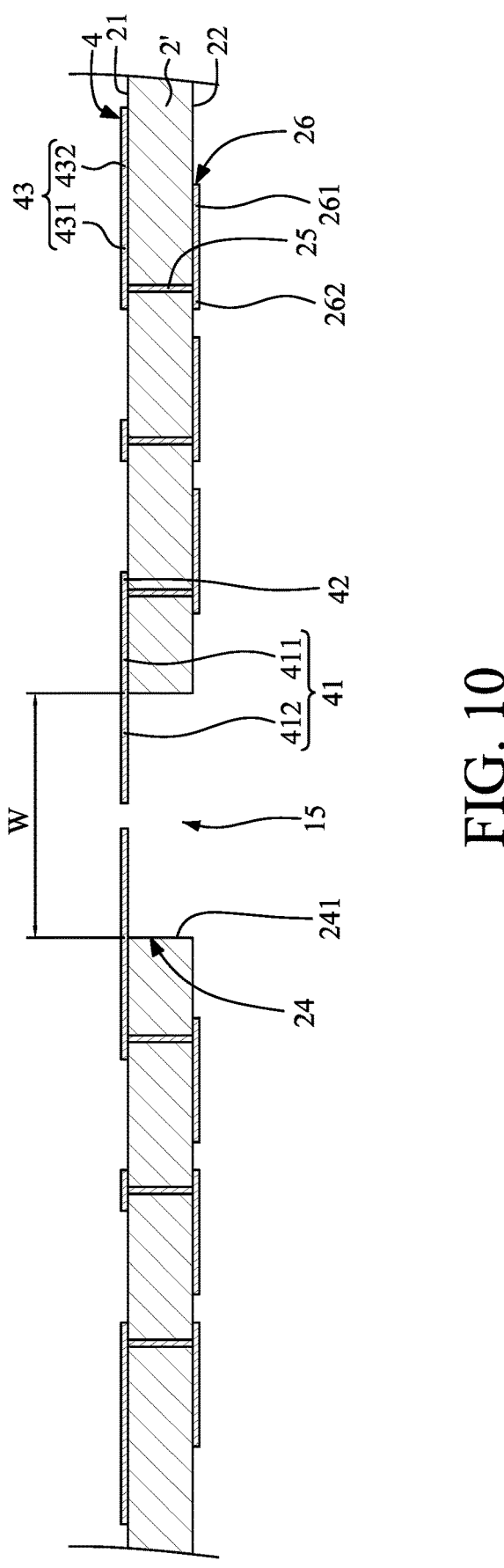
FIG. 10 illustrates one or more stages of a method of manufacturing a package structure in accordance with some embodiments of the present disclosure.

Referring to FIG. 10, a portion of the first substrate 2' in the predetermined area 28 may be removed from the second surface 22 (e.g., the bottom surface) by, for example, milling or etching, so as to form a first through hole 24. The first through hole 24 may extend through the first substrate 2'. Thus, the sidewall 241 of the first through hole 24 may extend between the first surface 21 (e.g., the top surface) and the second surface 22 (e.g., the bottom surface). The extending portion 412 of the inner trace 41 of the first patterned circuit layer 4 may be disposed at a position 15 corresponding to the first through hole 24 of the first substrate 2'. Thus, the extending portion 412 of the inner trace 41 of the first patterned circuit layer 4 may be exposed from the first through hole 24 of the first substrate 2'. The length L of the extending portion 412 of the inner trace 41 of the first patterned circuit layer 4 may be less than one half of a width W of the first through hole 24 of the first substrate 2'.

Figure 11:
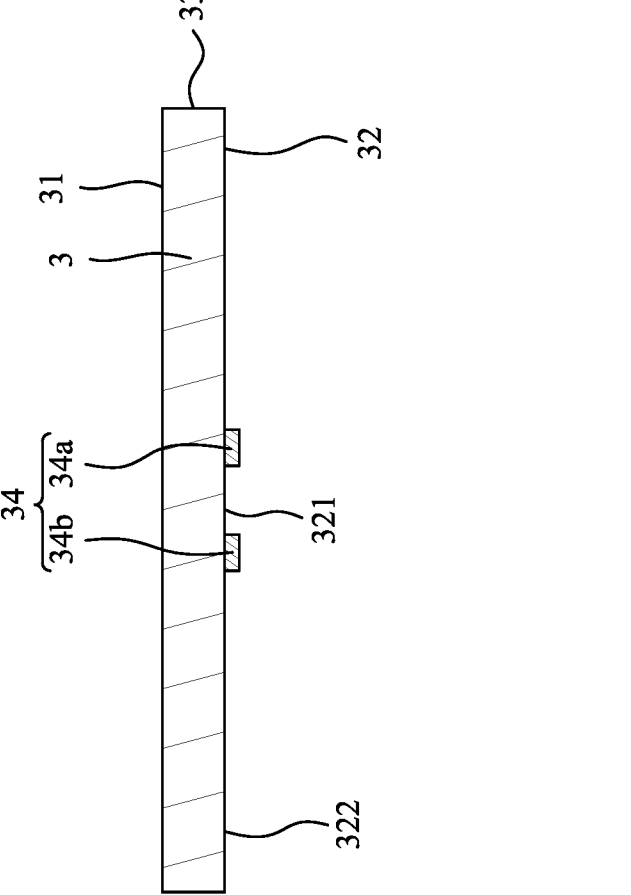
FIG. 11 illustrates one or more stages of a method of manufacturing a package structure in accordance with some embodiments of the present disclosure.

Referring to FIG. 11, a first electronic component 3 may be provided. The first electronic component 3 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The first electronic component 3 may have a first active surface 32 (e.g., a bottom surface), a first backside surface 31 (e.g., a top surface) and a first lateral surface 33. The first backside surface 31 (e.g., the top surface) may be opposite to the first active surface 32. The first lateral surface 33 may extend between the first active surface 32 and the first backside surface 31. The first active surface 32 of the first electronic component 3 may have a first portion 321 and a second portion 322. The second portion 322 of the first active surface 32 of the first electronic component 3 may surround the first portion 321 of the first active surface 32 of the first electronic component 3. The first electronic component 3 may include at least one first bump 34 (or pad) disposed adjacent to the first active surface 32 of the first electronic component 3. For example, the first bump 34 may include a first bump 34a and a first bump 34b.

Figure 12:
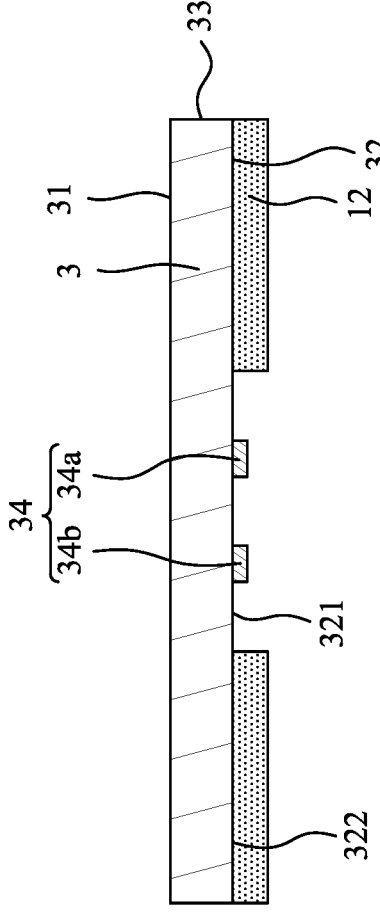
FIG. 12 illustrates one or more stages of a method of manufacturing a package structure in accordance with some embodiments of the present disclosure.

Referring to FIG. 12, a first adhesion layer 12 may be formed or disposed on the second portion 322 of the first active surface 32 of the first electronic component 3. In some embodiments, the first adhesion layer 12 may include an adhesive material, such as epoxy, a die attach film (DAF), glue or the like. The first adhesion layer 12 may be disposed around the first bump(s) 34. The first adhesion layer 12 may be at the periphery of the first electronic component 3.

Figure 13:
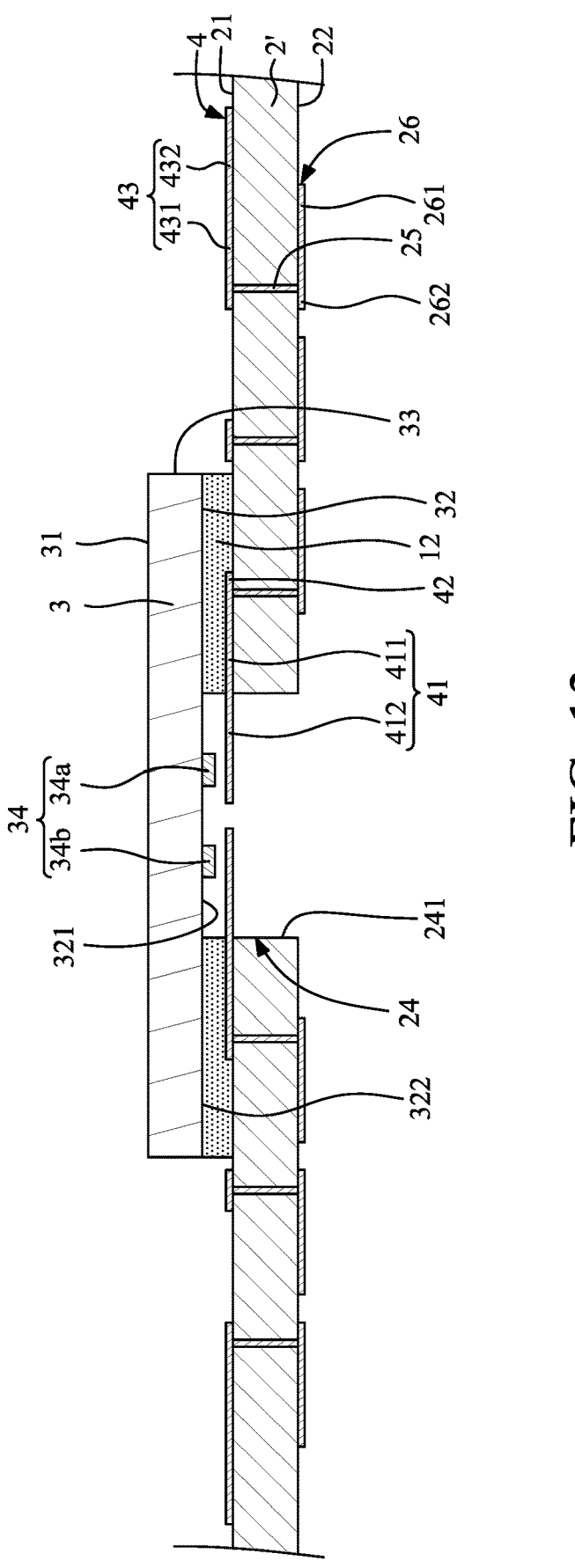
FIG. 13 illustrates one or more stages of a method of manufacturing a package structure in accordance with some embodiments of the present disclosure.

Referring to FIG. 13, the first electronic component 3 may be disposed on the first surface 21 of the first substrate 2'. Alternatively, the first electronic component 3 may be disposed over the first surface 21 of the first substrate 2', and may be attached to the first surface 21 of the first substrate 2'. The second portion 322 of the first active surface 32 of the first electronic component 3 may be adhered to the first surface 21 of the first substrate 2' through the first adhesion layer 12. The first electronic component 3 may be disposed corresponding to the first through hole 24 of the first substrate 2'. The first active surface 32 (e.g., the bottom surface) of the first electronic component 3 may face the first substrate 2'.

The first portion 321 of the first active surface 32 of the first electronic component 3 may be disposed over the first through hole 24 of the first substrate 2', and may be exposed in the first through hole 24 of the first substrate 2'. Thus, the extending portion 412 of the inner trace 41 of the first patterned circuit layer 4 may be located between the first through hole 24 of the first substrate 2' and the first bump(s) 34 of the first electronic component 3.

Figure 14:
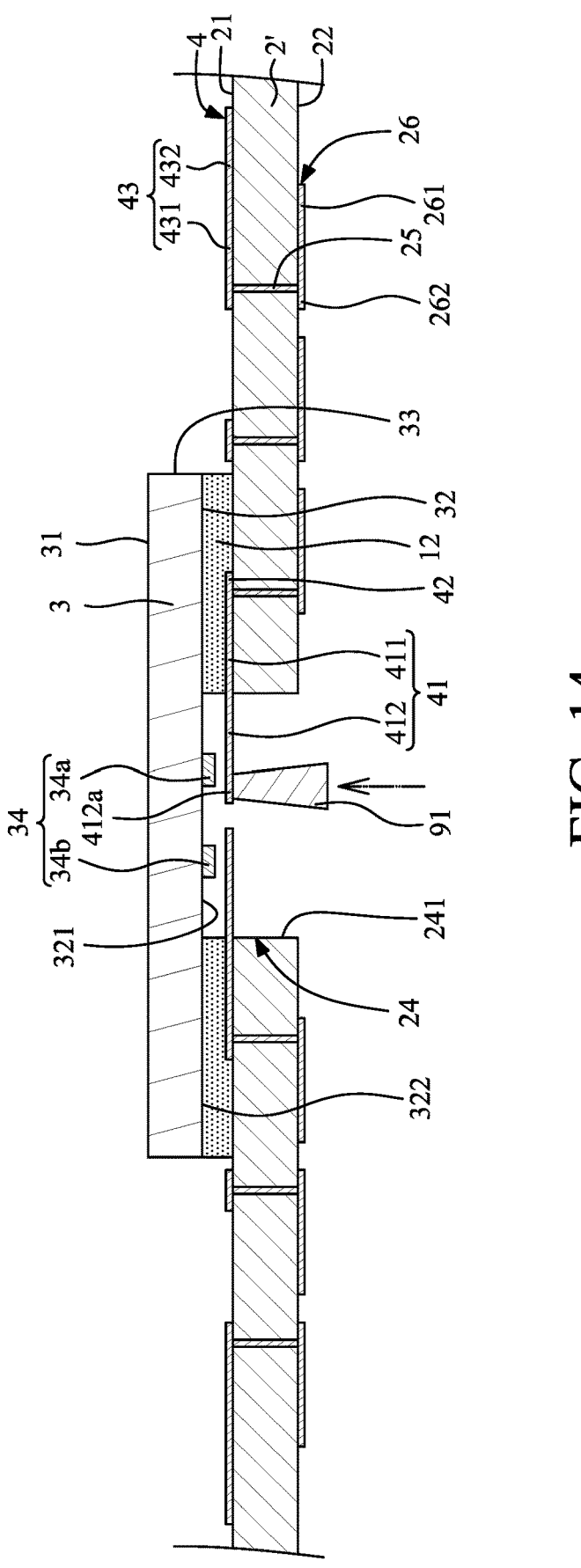
FIG. 14 illustrates one or more stages of a method of manufacturing a package structure in accordance with some embodiments of the present disclosure.

Referring to FIG. 14, a press head 91 may be provided to contact an end 412a of the extending portion 412 of the inner trace 41 of the first patterned circuit layer 4.

Figure 15:
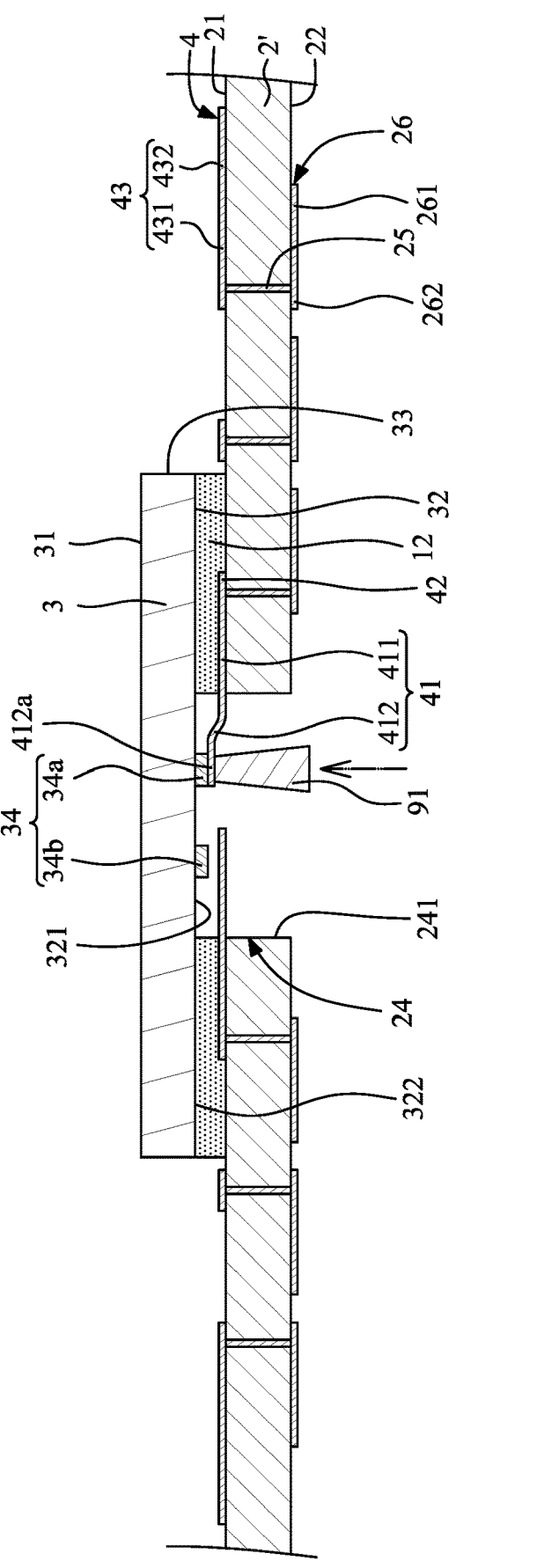
FIG. 15 illustrates one or more stages of a method of manufacturing a package structure in accordance with some embodiments of the present disclosure.

Referring to FIG. 15, the press head 91 may move toward the first electronic component 3. Thus, the end 412a of the extending portion 412 of the first patterned circuit layer 4 may be pressed to contact the first bump 34a of the first electronic component 3. Then, the end 412a of the extending portion 412 of the first patterned circuit layer 4 may be connected or bonded to the first bump 34a of the first electronic component 3 by ultrasonic welding or ultrasonic bonding. Meanwhile, the extending portion 412 of the first patterned circuit layer 4 may be bent.

The end 412a of the extending portion 412 of the inner trace 41 of the first patterned circuit layer 4 may be connected to the first bump 34a of the first electronic component 3. Thus, the first active surface 32 of the first electronic component 3 may be electrically connected to the first patterned circuit layer 4 of the first substrate 2' through the extending portion 412 of the inner trace 41 of the first patterned circuit layer 4.

Figure 16:
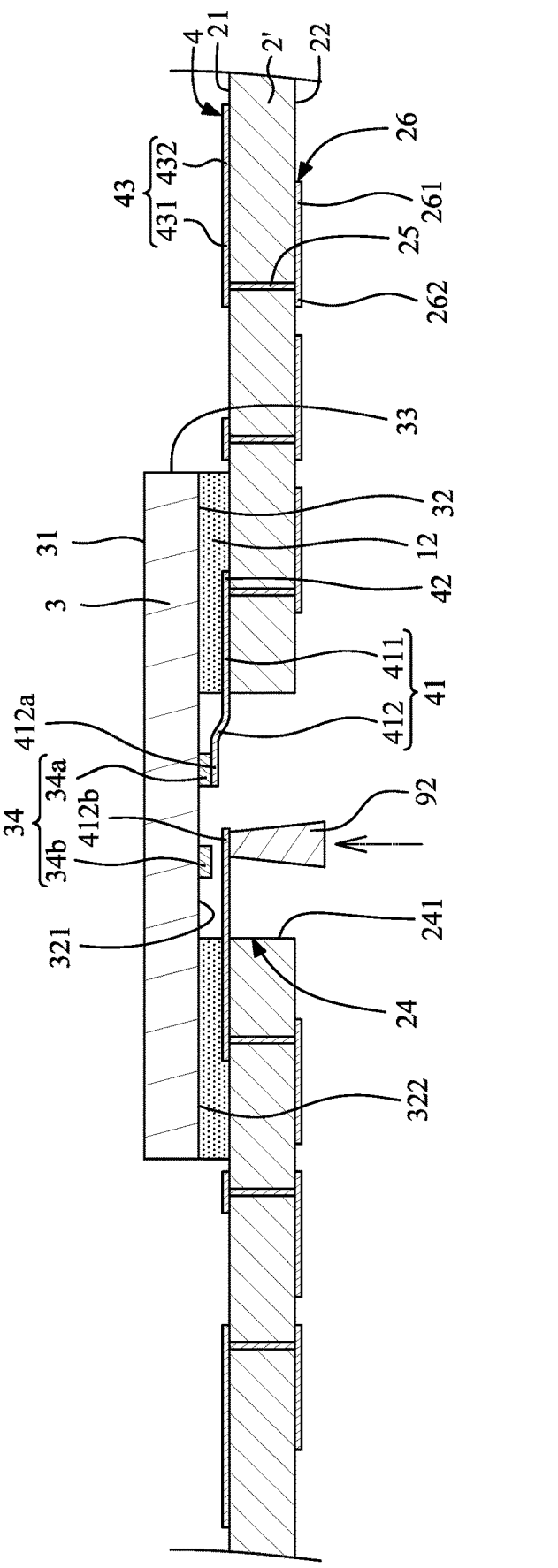
FIG. 16 illustrates one or more stages of a method of manufacturing a package structure in accordance with some embodiments of the present disclosure.

Referring to FIG. 16, the press head 91 may be removed. A press head 92 may be provided to contact an end 412b of the extending portion 412 of the inner trace 41 of first the patterned circuit layer 4. The press head 92 of FIG. 16 may be same as or different from the press head 91 of FIG. 14.

Figure 17:
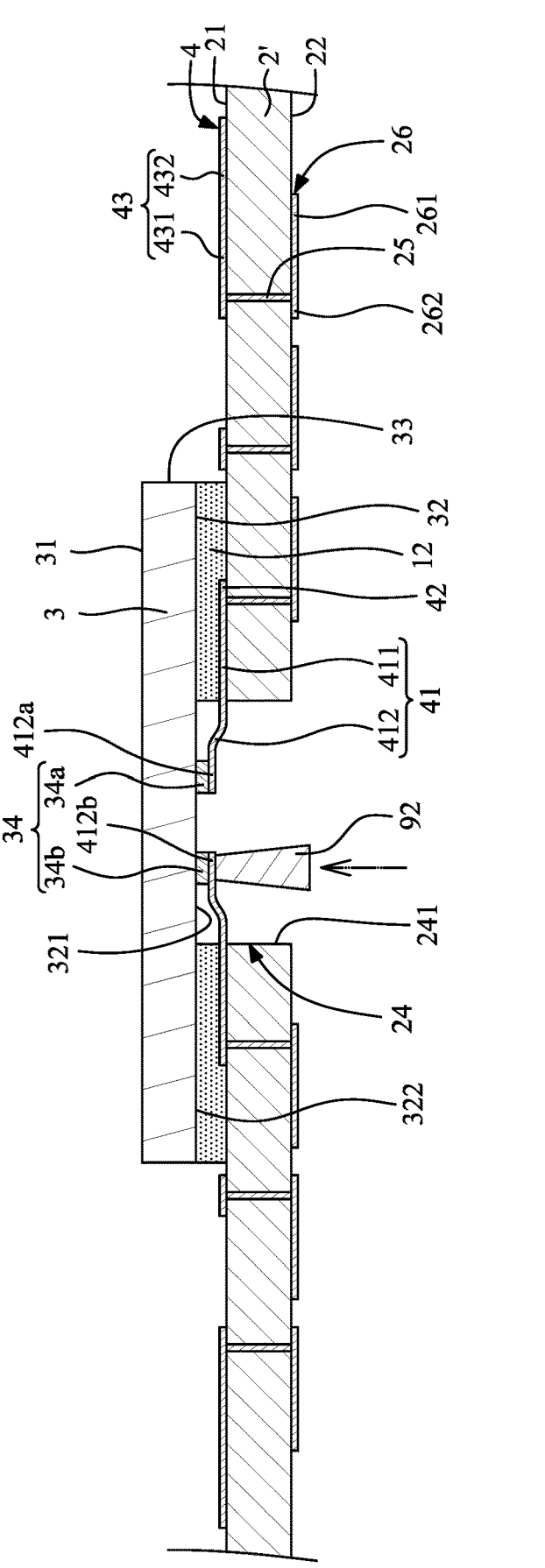
FIG. 17 illustrates one or more stages of a method of manufacturing a package structure in accordance with some embodiments of the present disclosure.

Referring to FIG. 17, the press head 92 may move toward the first electronic component 3. Thus, the end 412b of the extending portion 412 of the first patterned circuit layer 4 may be pressed to contact the first bump 34b of the first electronic component 3. Then, the end 412b of the extending portion 412 of the first patterned circuit layer 4 may be connected or bonded to the first bump 34b of the first electronic component 3 by ultrasonic welding or ultrasonic bonding.

Figure 18:
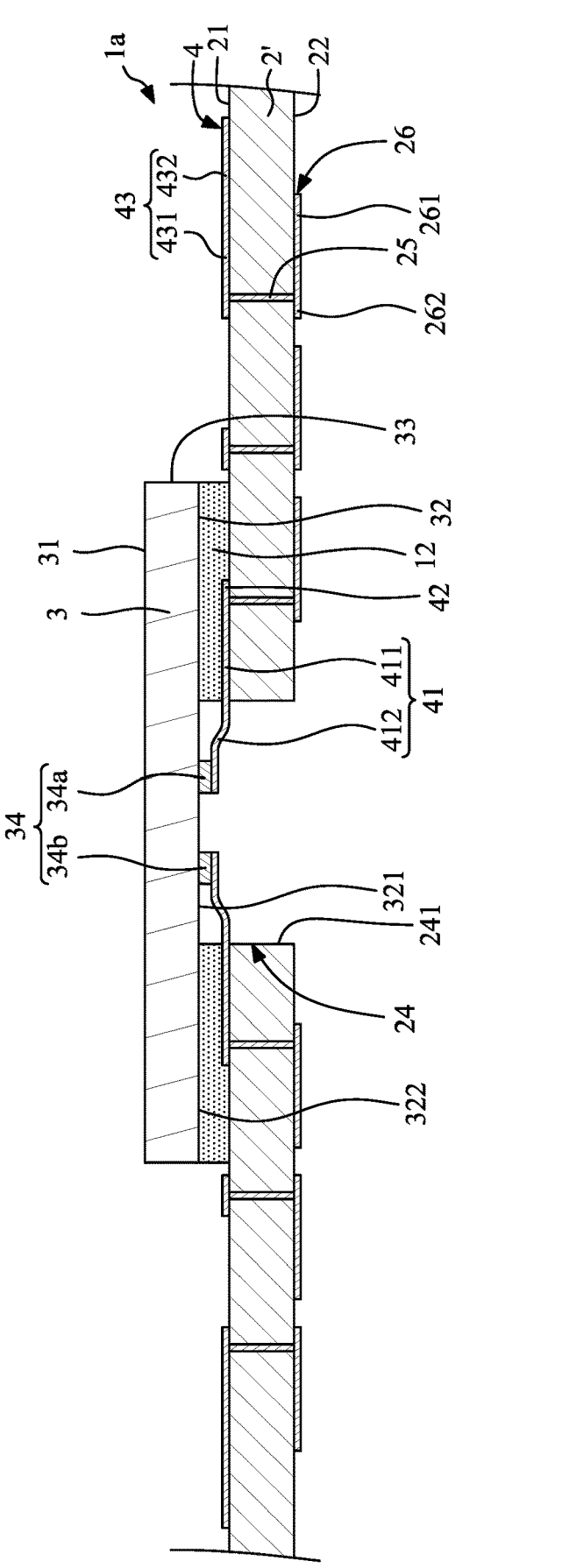
FIG. 18 illustrates one or more stages of a method of manufacturing a package structure in accordance with some embodiments of the present disclosure.

Referring to FIG. 18, the press head 92 may be removed so as to form a first assembly structure 1a. The first assembly structure 1a may include the first substrate 2' and the first electronic component 3 electrically connected to the first patterned circuit layer 4 of the first substrate 2'.

Referring to FIGS. 19 to 26, a second assembly structure 1b may be provided. The second assembly structure 1b may be formed as following stages.

Figure 19:
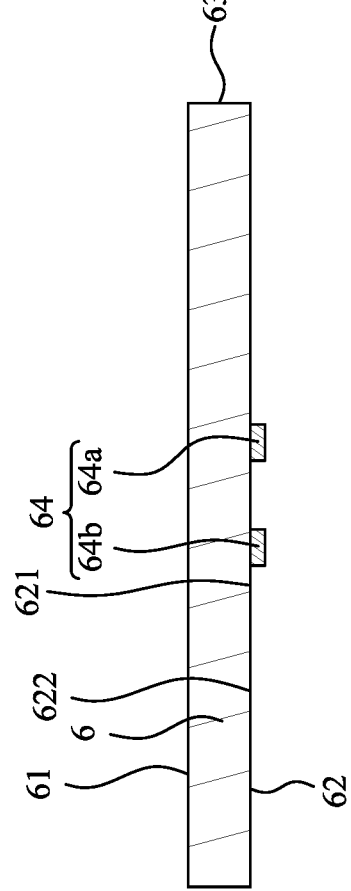
FIG. 19 illustrates one or more stages of a method of manufacturing a package structure in accordance with some embodiments of the present disclosure.

Referring to FIG. 19, a second electronic component 6 may be provided. The second electronic component 6 may be same as or similar to the first electronic component 3. The second electronic component 6 may have a second active surface 62 (e.g., a bottom surface), a second backside surface 61 (e.g., a top surface) and a second lateral surface 63. The second backside surface 61 (e.g., the top surface) may be opposite to the second active surface 62. The second lateral surface 63 may extend between the second active surface 62 and the second backside surface 61. The second active surface 62 of the second electronic component 6 may have a first portion 621 and a second portion 622. The second portion 622 of the second active surface 62 of the second electronic component 6 may surround the first portion 621 of the second active surface 62 of the second electronic component 6. The second electronic component 6 may include at least one second bump 64 (or pad) disposed adjacent to the second active surface 62 of the second electronic component 6. For example, the second bump 64 may include a second bump 64a and a second bump 64b.

Figure 20:
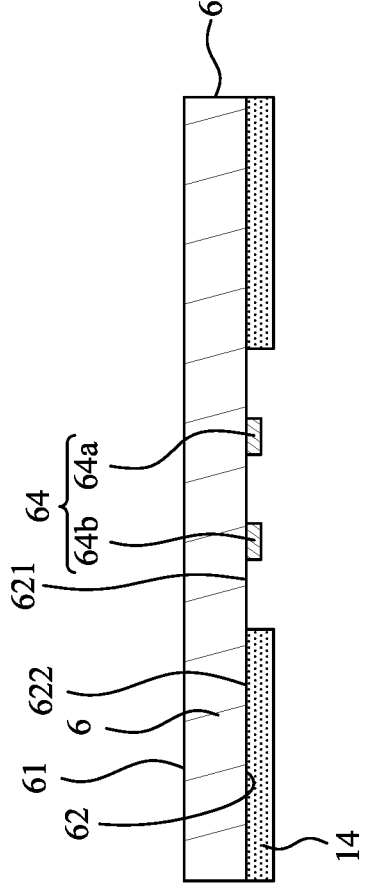
FIG. 20 illustrates one or more stages of a method of manufacturing a package structure in accordance with some embodiments of the present disclosure.

Referring to FIG. 20, a second adhesion layer 14 may be formed or disposed on the second portion 622 of the second active surface 62 of the second electronic component 6. In some embodiments, the second adhesion layer 14 may include an adhesive material, such as epoxy, a die attach film (DAF), glue or the like. The second adhesion layer 14 may be disposed around the second bump(s) 64. The second adhesion layer 14 may be at the periphery of the second electronic component 6.

Figure 21:
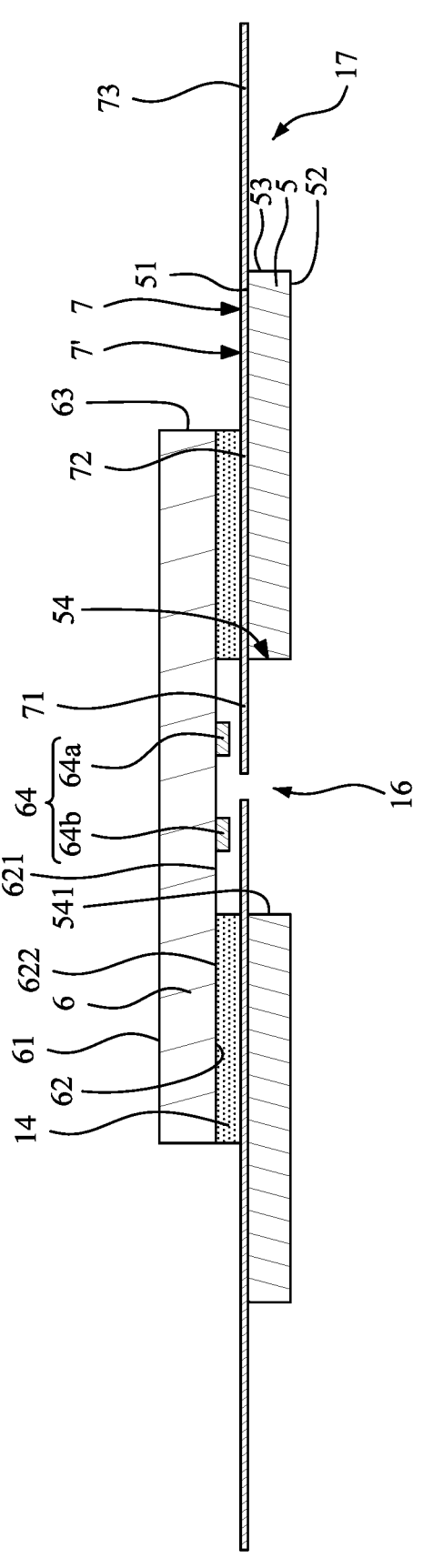
FIG. 21 illustrates one or more stages of a method of manufacturing a package structure in accordance with some embodiments of the present disclosure.

Referring to FIG. 21, the second electronic component 6 may be disposed on a first surface 51 of a second substrate 5. The second substrate 5 of FIG. 21 may be same as the second substrate 5 of FIG. 1. The second substrate 5 may have a first surface 51 (e.g., a top surface), a second surface 52 (e.g., a bottom surface) and a lateral surface 53. The second surface 52 (e.g., the bottom surface) may be opposite to the first surface 51 (e.g., the top surface). The lateral surface 53 may extend between the first surface 51 (e.g., the top surface) and the second surface 52 (e.g., the bottom surface). The second substrate may define a second through hole 54 extending through the second substrate 5. Thus, the sidewall 541 of the second through hole 54 may extend between the first surface 51 (e.g., the top surface) and the second surface 52 (e.g., the bottom surface).

The second substrate 5 may include a second patterned circuit layer 7. The second patterned circuit layer 7 may be disposed adjacent to the first surface 51 (e.g., the top surface) of the second substrate 5. The second patterned circuit layer 7 may be disposed on the first surface 51 (e.g., the top surface) of the second substrate 5. The second patterned circuit layer 7 may include a plurality of traces 7'. For example, the second patterned circuit layer 7 may be formed or patterned from a metal foil such as a copper foil. Each of the traces 7' may include an inner extending portion 71, a main portion 72 and an outer extending portion 73.

The main portion 72 may connect the inner extending portion 71 and the outer extending portion 73. The inner extending portion 71 may be disposed at a position 16 corresponding to the second through hole 54 of the second substrate 5. For example, the inner extending portion 71 of the trace 7' of the second patterned circuit layer 7 may extend beyond the sidewall 541 of the second through hole 54.

The outer extending portion 73 of the trace 7' of the second patterned circuit layer 7 may extend beyond the lateral surface 53 of the second substrate 5. Alternatively, the outer extending portion 73 of the trace 7' of the second patterned circuit layer 7 may extend to a position 17 outside the lateral surface 53 of the second substrate 5. As shown in FIG. 21, there may be no inner electrical connection (or electrical path) within the second substrate 5. Thus, there may be no electrical connection between the first surface 51 of the second substrate 5 and the second surface 52 of the second substrate 5.

The second portion 622 of the second active surface 62 of the second electronic component 6 may be adhered to the first surface 51 of the second substrate 5 through the second adhesion layer 14. The second electronic component 6 may be disposed corresponding to the second through hole 54 of the second substrate 5. The second active surface 62 (e.g., the bottom surface) of the second electronic component 6 may face the second substrate 5.

The first portion 621 of the second active surface 62 of the second electronic component 6 may be disposed over the second through hole 54 of the second substrate 5, and may be exposed in the second through hole 54 of the second substrate 5. Thus, the inner extending portion 71 of the trace 7' of the second patterned circuit layer 7 may be located between the second through hole 54 of the second substrate 5 and the second bump(s) 64 of the second electronic component 6.

Figure 22:
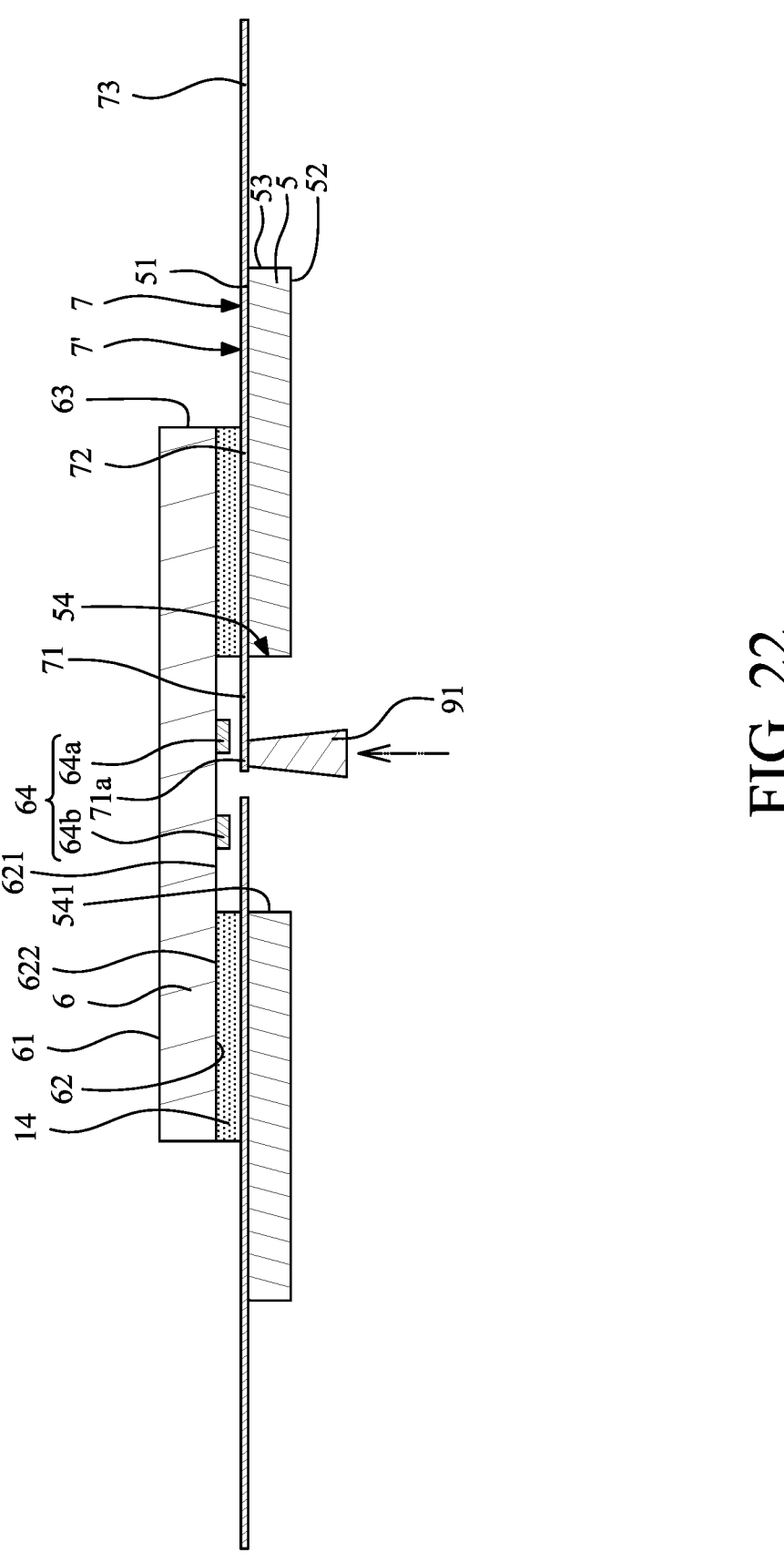
FIG. 22 illustrates one or more stages of a method of manufacturing a package structure in accordance with some embodiments of the present disclosure.

Referring to FIG. 22, a press head 91 may be provided to contact an end 71a of the inner extending portion 71 of the second patterned circuit layer 7.

Figure 23:
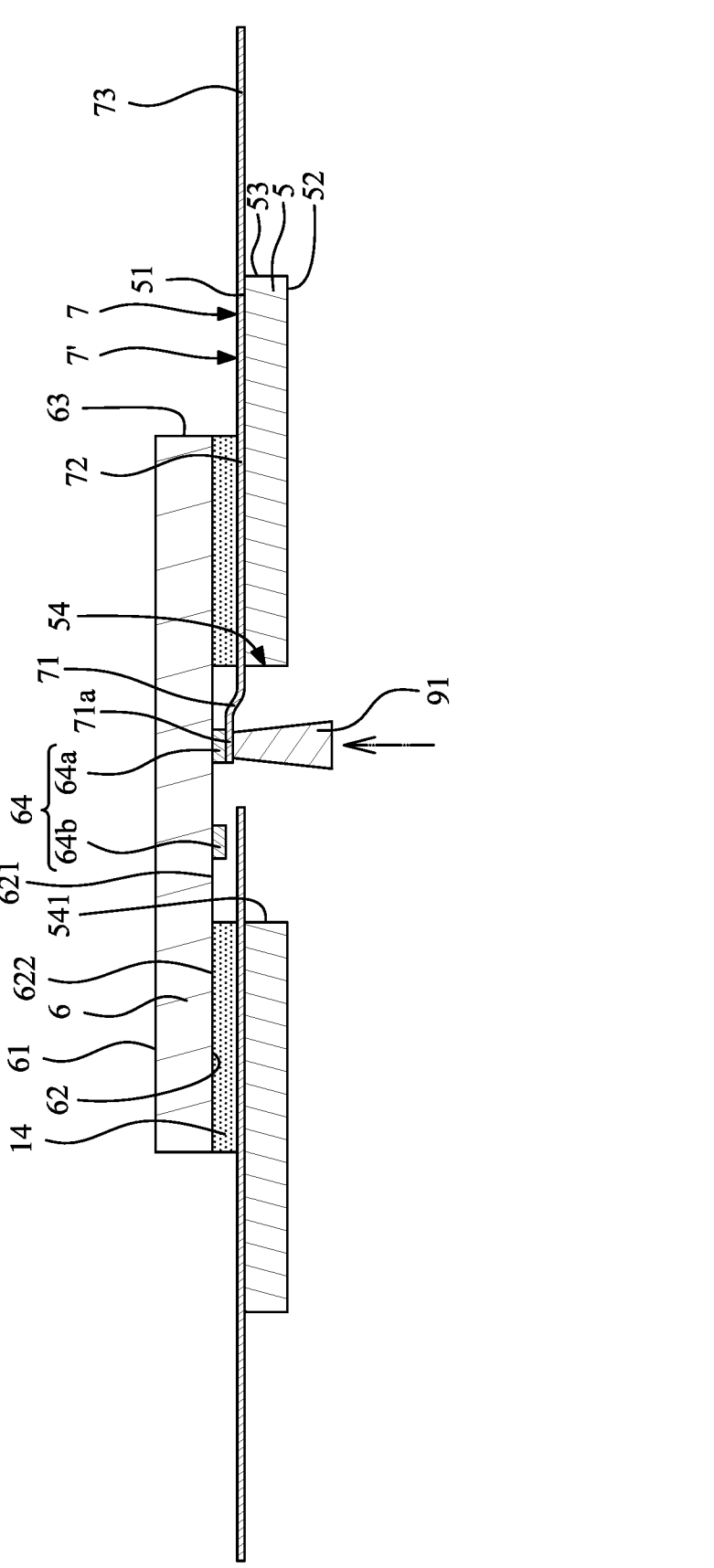
FIG. 23 illustrates one or more stages of a method of manufacturing a package structure in accordance with some embodiments of the present disclosure.

Referring to FIG. 23, the press head 91 may move toward the second electronic component 6. Thus, the end 71a of the inner extending portion 71 of the second patterned circuit layer 7 may be pressed to contact the second bump 64a of the second electronic component 6. Then, the end 71a of the inner extending portion 71 of the second patterned circuit layer 7 may be connected or bonded to the second bump 64a of the second electronic component 6 by ultrasonic welding or ultrasonic bonding. Meanwhile, the inner extending portion 71 of the second patterned circuit layer 7 may be bent.

The end 71a of the inner extending portion 71 of the trace 7' of the second patterned circuit layer 7 may be connected to the second bump 64a of the second electronic component 6. Thus, the second active surface 62 of the second electronic component 6 may be electrically connected to the second patterned circuit layer 7 of the second substrate 5 through the inner extending portion 71 of the trace 7' of the second patterned circuit layer 7.

Figure 24:
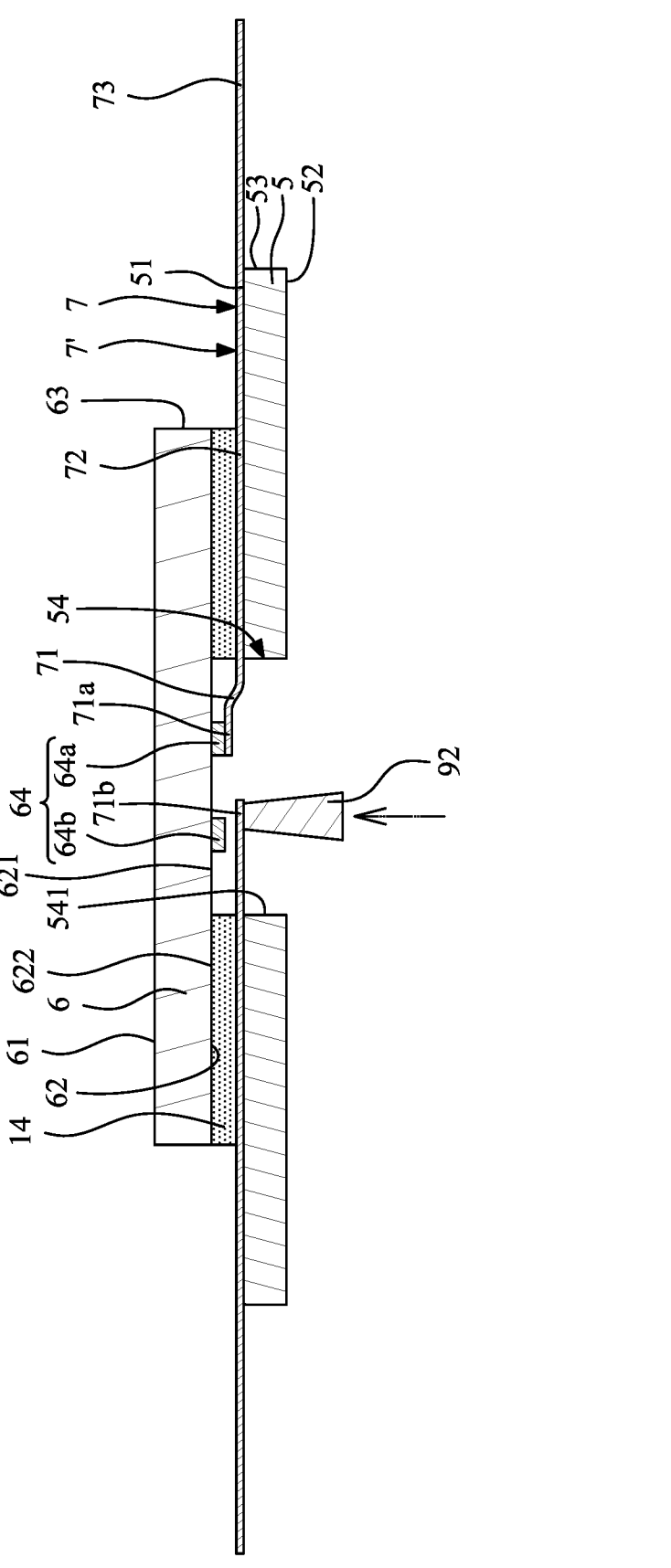
FIG. 24 illustrates one or more stages of a method of manufacturing a package structure in accordance with some embodiments of the present disclosure.

Referring to FIG. 24, the press head 91 may be removed. A press head 92 may be provided to contact an end 71b of the inner extending portion 71 of the trace 7' of the second patterned circuit layer 7. The press head 92 of FIG. 24 may be same as or different from the press head 91 of FIG. 22.

Figure 25:
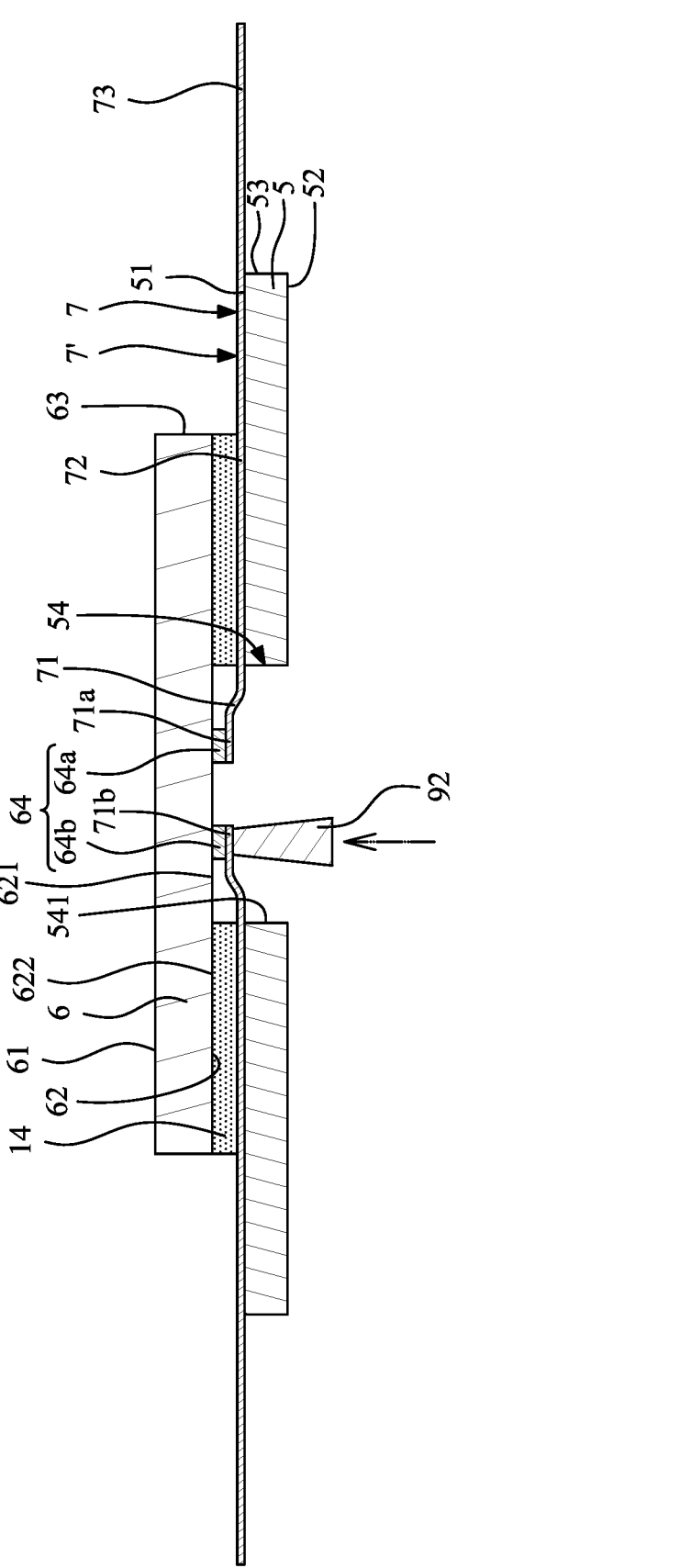
FIG. 25 illustrates one or more stages of a method of manufacturing a package structure in accordance with some embodiments of the present disclosure.

Referring to FIG. 25, the press head 92 may move toward the second electronic component 6. Thus, the end 71b of the inner extending portion 71 of the trace 7' of the second patterned circuit layer 7 may be pressed to contact the second bump 64b of the second electronic component 6. Then, the end 71b of the inner extending portion 71 of the trace 7' of the second patterned circuit layer 7 may be connected or bonded to the second bump 64b of the second electronic component 6 by ultrasonic welding or ultrasonic bonding.

Figure 26:
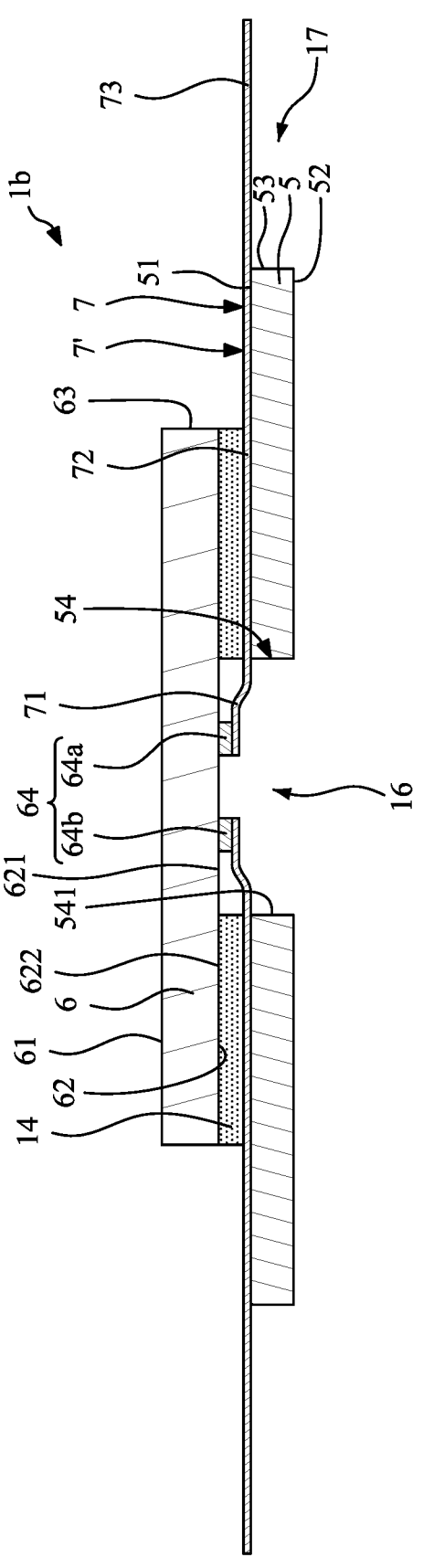
FIG. 26 illustrates one or more stages of a method of manufacturing a package structure in accordance with some embodiments of the present disclosure.

Referring to FIG. 26, the press head 92 may be removed so as to form a second assembly structure 1b. The second assembly structure 1b may include the second substrate 5 and the second electronic component 6 electrically connected to the second patterned circuit layer 7 of the second substrate 5.

Figure 27:
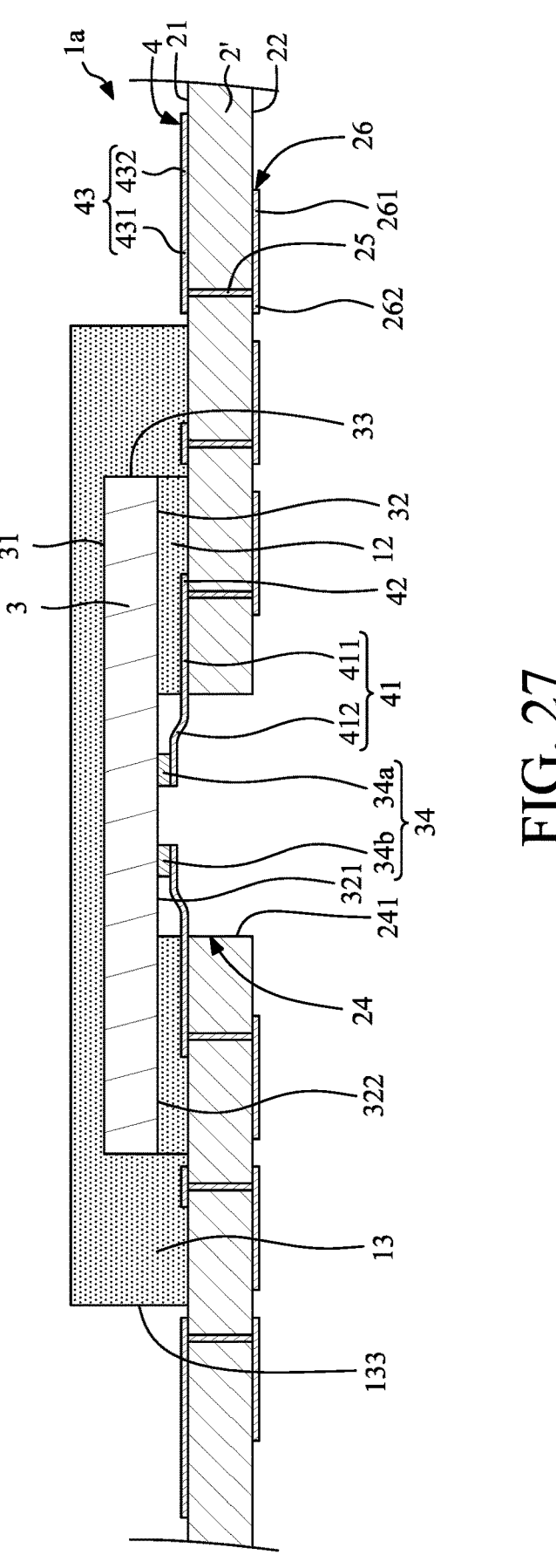
FIG. 27 illustrates one or more stages of a method of manufacturing a package structure in accordance with some embodiments of the present disclosure.

Referring to FIG. 27, an intermediate adhesion layer 13 is formed or disposed on the first surface 21 of the first substrate 2' to cover the first electronic component 3 and the first adhesion layer 12.

Figure 28:
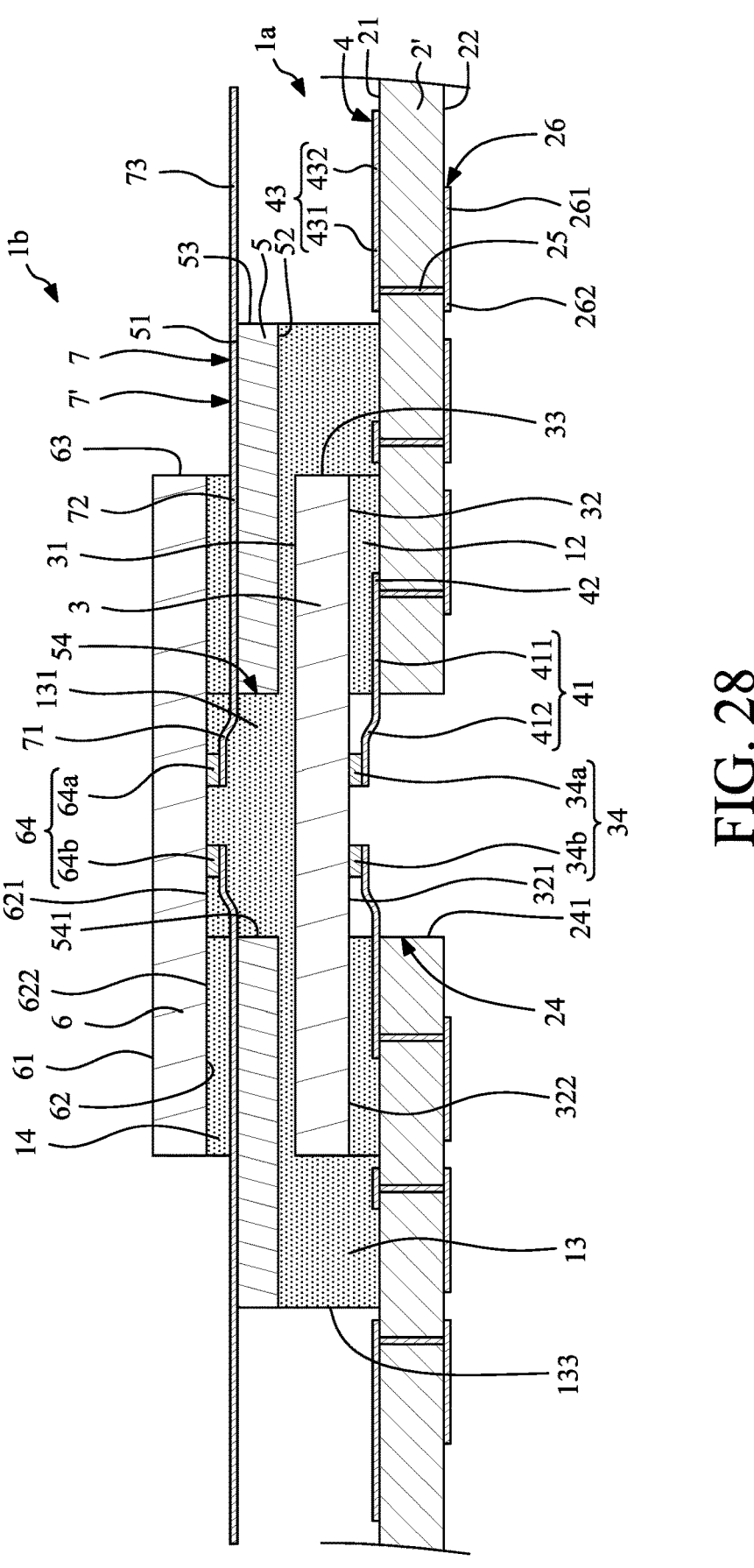
FIG. 28 illustrates one or more stages of a method of manufacturing a package structure in accordance with some embodiments of the present disclosure.

Referring to FIG. 28, the second assembly structure 1b is attached to the first assembly structure 1a through the intermediate adhesion layer 13.

Figure 29:
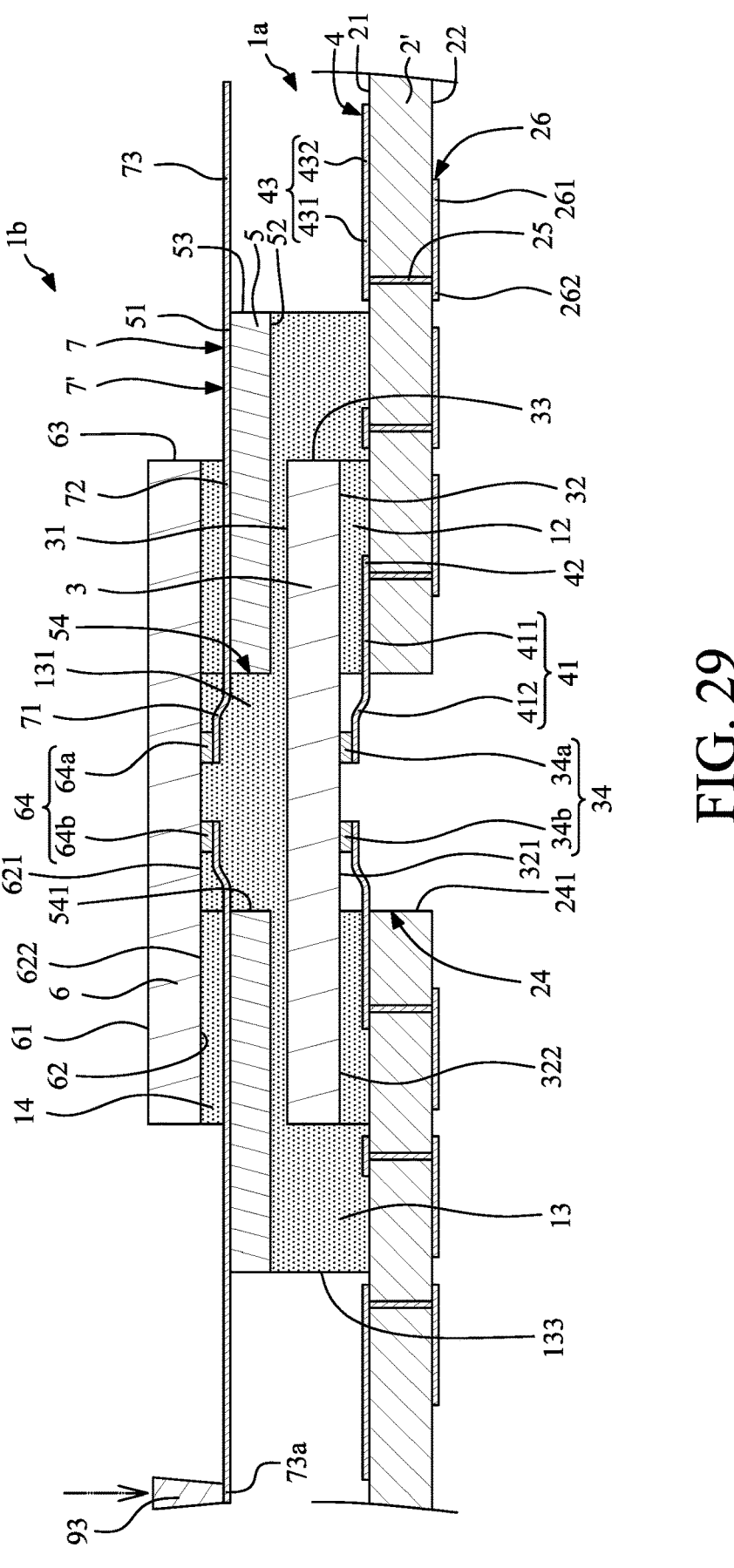
FIG. 29 illustrates one or more stages of a method of manufacturing a package structure in accordance with some embodiments of the present disclosure.

Referring to FIG. 29, a press head 93 may be provided to contact an end 73a of the outer extending portion 73 of the trace 7' of the second patterned circuit layer 7.

Figure 30:
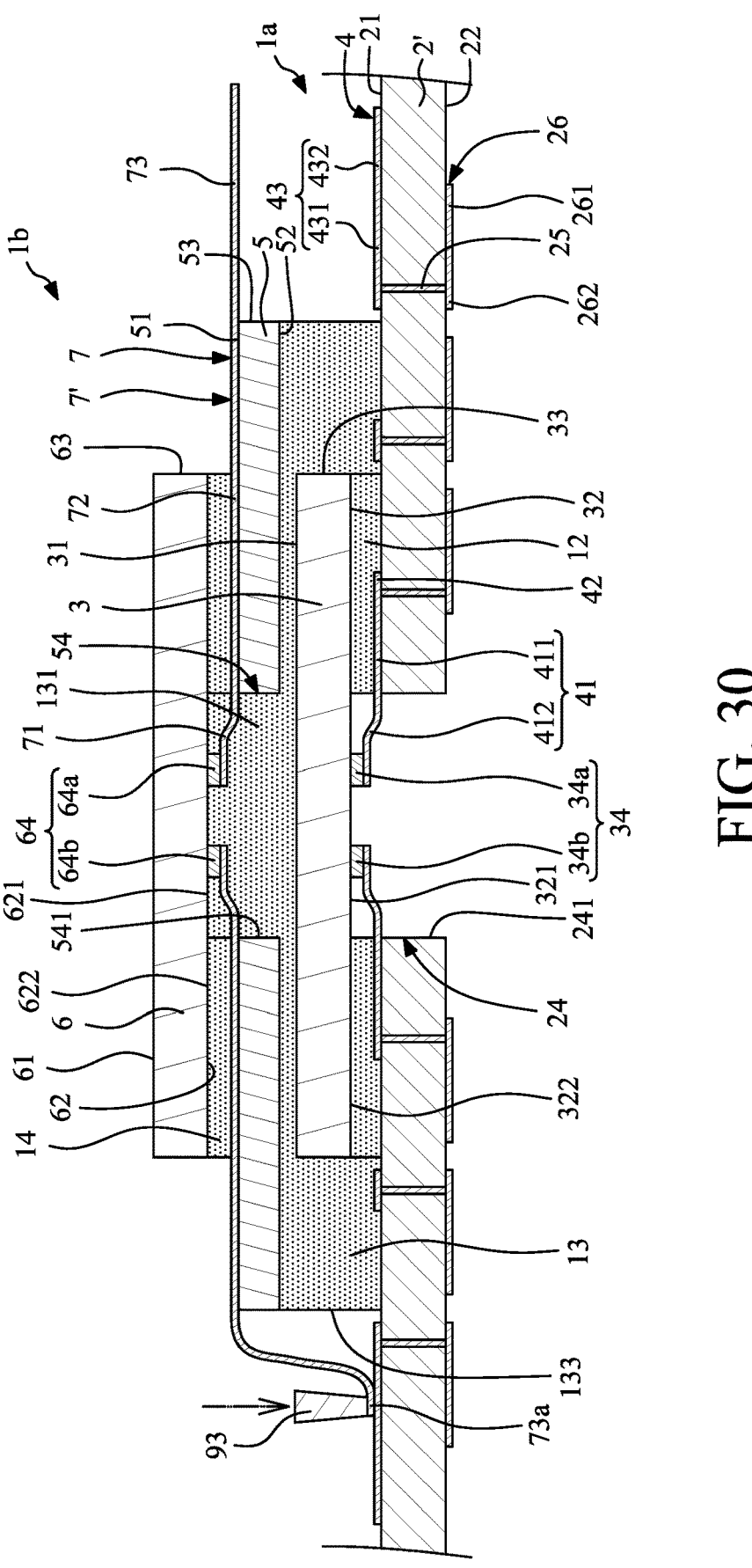
FIG. 30 illustrates one or more stages of a method of manufacturing a package structure in accordance with some embodiments of the present disclosure.

Referring to FIG. 30, the press head 93 may move toward the first substrate 2'. Thus, the end 73a of the outer extending portion 73 of the second patterned circuit layer 7 may be pressed to move along the lateral surface 53 of the second electronic component 5 and the lateral surface 33 of the first electronic component 3. As a result, the end 73a of the outer extending portion 73 of the trace 7' of the second patterned circuit layer 7 may be pressed to contact the connecting portion 432 of the outer trace 43 of the first patterned circuit layer 4. Then, the end 73a of the outer extending portion 73 of the trace 7' of the second patterned circuit layer 7 may be connected or bonded to the connecting portion 432 of the outer trace 43 of the first patterned circuit layer 4 by ultrasonic welding or ultrasonic bonding. Meanwhile, the outer extending portion 73 of the trace 7' of the second patterned circuit layer 7 may be bent. Therefore, the second active surface 62 of the second electronic component 6 may be electrically connected to the first patterned circuit layer 4 through the second patterned circuit layer 7.

Figure 31:
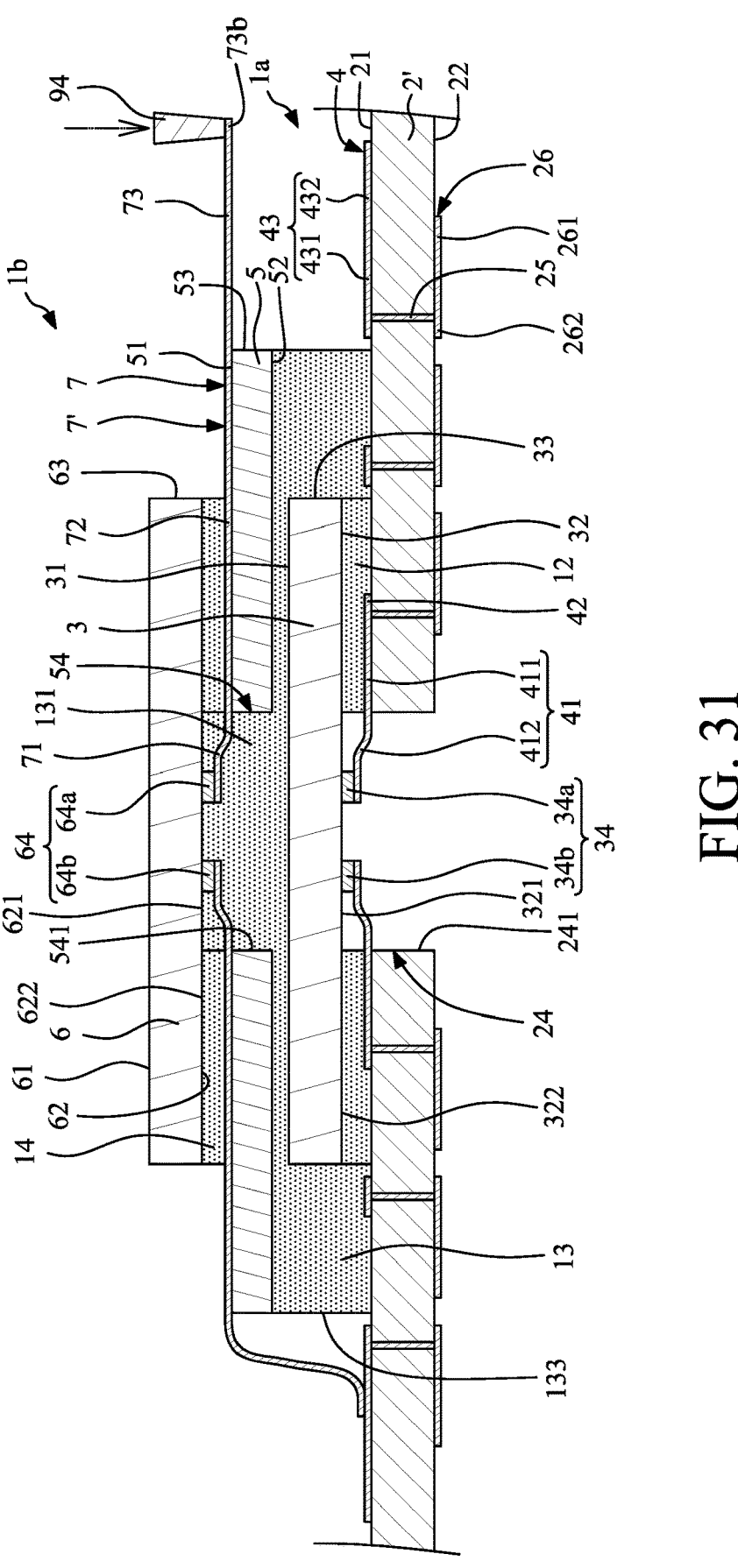
FIG. 31 illustrates one or more stages of a method of manufacturing a package structure in accordance with some embodiments of the present disclosure.

Referring to FIG. 31, the press head 93 may be removed. A press head 94 may be provided to contact an end 73b of the outer extending portion 73 of the trace 7' of the second patterned circuit layer 7. The press head 94 of FIG. 31 may be same as or different from the press head 93 of FIG. 29.

Figure 32:
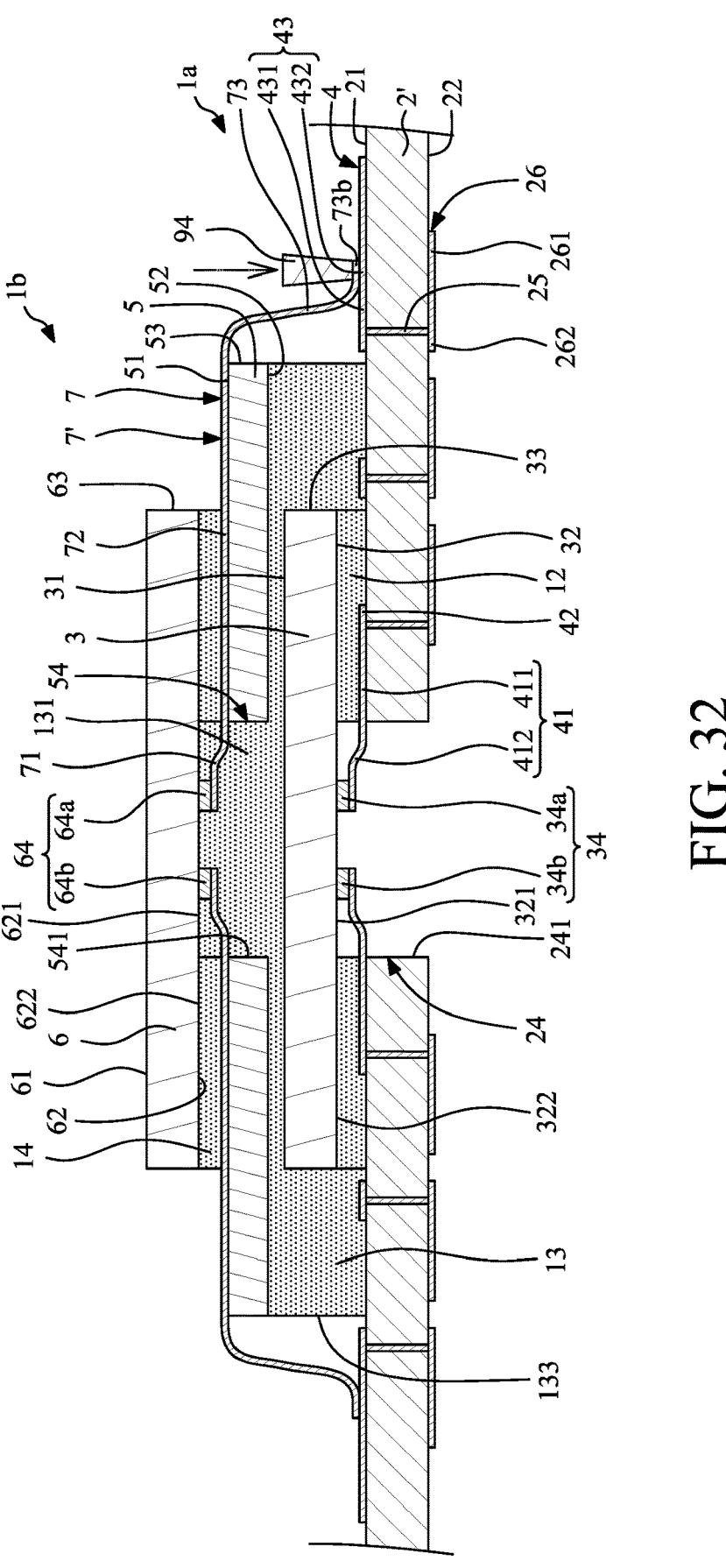
FIG. 32 illustrates one or more stages of a method of manufacturing a package structure in accordance with some embodiments of the present disclosure.

Referring to FIG. 32, the press head 94 may move toward the first substrate 2'. Thus, the end 73b of the outer extending portion 73 of the trace 7' of the second patterned circuit layer 7 may be pressed to contact the connecting portion 432 of the outer trace 43 of the first patterned circuit layer 4. Then, the end 73b of the outer extending portion 73 of the trace 7' of the second patterned circuit layer 7 may be connected or bonded to the connecting portion 432 of the outer trace 43 of the first patterned circuit layer 4 by ultrasonic welding or ultrasonic bonding.

Figure 33:
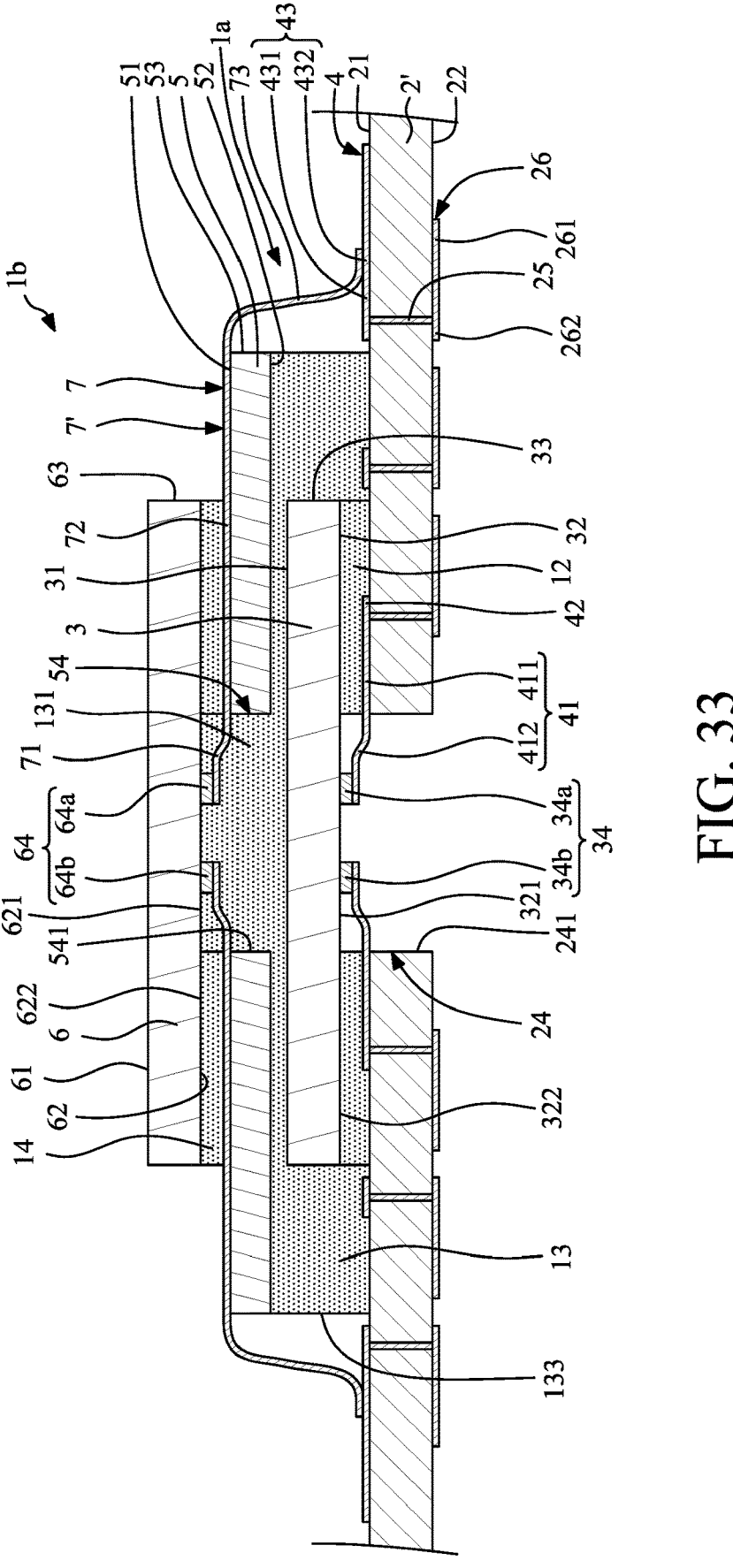
FIG. 33 illustrates one or more stages of a method of manufacturing a package structure in accordance with some embodiments of the present disclosure.

Referring to FIG. 33, the press head 94 may be removed.

Figure 34:
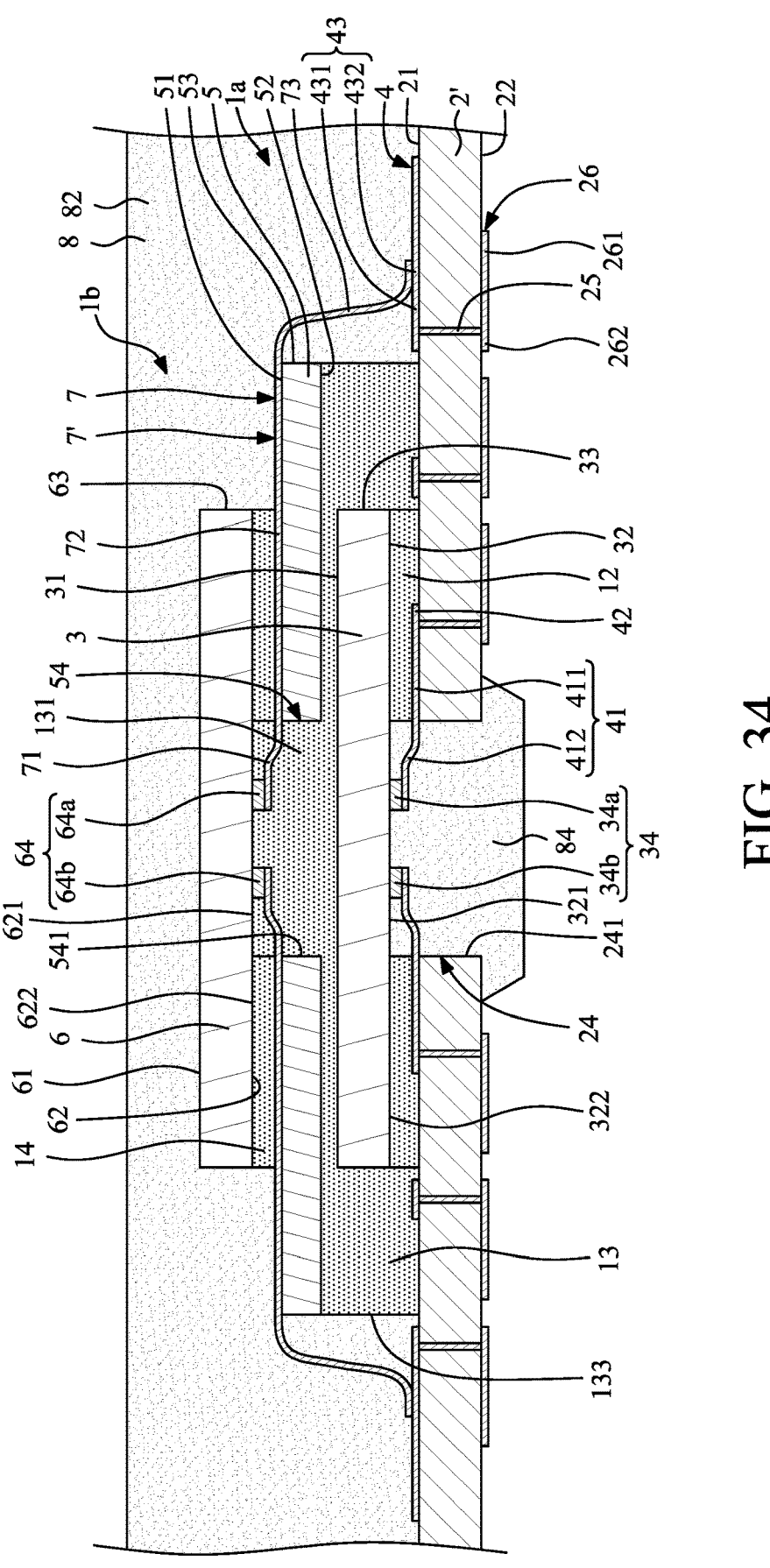
FIG. 34 illustrates one or more stages of a method of manufacturing a package structure in accordance with some embodiments of the present disclosure.

Referring to FIG. 34, a package body 8 may be formed or disposed to encapsulate the second assembly structure 1b and the outer extending portion 73 of the trace 7' of the second patterned circuit layer 7. In some embodiments, the package body 8 may be formed by a molding technique, such as transfer molding or compression molding. The package body 8 may include a first portion 82 and a second portion 84 formed concurrently and integrally. The first portion 82 may be disposed on the first surface 21 of the first substrate 2', and may encapsulate the first electronic component 3, the intermediate adhesion layer 13, the second substrate 5, the second electronic component 6 and the outer extending portion 73 of the trace 7' of the second patterned circuit layer 7. The second portion 84 may be disposed in the first through hole 24 of the first substrate 2', and may encapsulate the extending portion 412 of the inner trace 41 of the first patterned circuit layer 4. In addition, the second portion 84 of the package body 8 may contact the first portion 321 of the first active surface 32 of the first electronic component 3.

Then, one or more external connectors 11 may be formed or disposed on the bonding pads 261 of the bottom pattern 26 to provide electrical connections, for example, I/O connections, of the first substrate 2'. In some embodiments, the operation of forming the external connectors 11 may be conducted before the operation of forming the package body 8.

Then, a singulation process may be conducted to form the package structure 1 of FIG. 1.

FIG. 35 illustrates a flow chart of a method 100 of manufacturing a package structure 1 in accordance with some embodiments of the present disclosure.

The step or operation S101 is providing a first assembly structure including a first substrate and a first electronic component electrically connected to a first patterned circuit layer of the first substrate. For example, as shown in FIG. 18, a first assembly structure 1a is provided. The first assembly structure 1a may include the first substrate 2' and the first electronic component 3 electrically connected to the first patterned circuit layer 4 of the first substrate 2'.

The step or operation S102 is providing a second assembly structure including a second substrate and a second electronic component electrically connected to a second patterned circuit layer of the second substrate, wherein an outer extending portion of the second patterned circuit layer extends to a position outside a lateral surface of the second substrate. For example, as shown in FIG. 26, a second assembly structure 1b is provided. The second assembly structure 1b may include the second substrate 5 and the second electronic component 6 electrically connected to the second patterned circuit layer 7 of the second substrate 5. An outer extending portion 73 of the second patterned circuit layer 7 extends to a position 17 outside a lateral surface 53 of the second substrate 5.

The step or operation S103 is attaching the second assembly structure to the first assembly structure. For example, as shown in FIG. 28, the second assembly structure 1b is attached to the first assembly structure 1a through the intermediate adhesion layer 13.

The step or operation S104 is pressing an end of the outer extending portion of the second patterned circuit layer to connect the first patterned circuit layer. For example, as shown in FIG. 30, the end 73a of the outer extending portion 73 of the trace 7' of the second patterned circuit layer 7 may be pressed to connect the connecting portion 432 of the outer trace 43 of the first patterned circuit layer 4.

One aspect of the present disclosure provides a package structure. The package structure includes a first substrate, a first electronic component, a second substrate and a second electronic component. The first substrate includes a first patterned circuit layer and defines a first through hole. The first electronic component is disposed over the first through hole of the first substrate. The first electronic component is electrically connected to the first patterned circuit layer of the first substrate through an extending portion of the first patterned circuit layer extending beyond a sidewall of the first through hole. The second substrate includes a second patterned circuit layer and defines a second through hole. The second electronic component is disposed over the second through hole of the second substrate. The second electronic component is electrically connected to the second patterned circuit layer of the second substrate through an inner extending portion of the second patterned circuit layer extending beyond a sidewall of the second through hole.

Another aspect of the present disclosure provides a package structure. The package structure includes a first substrate, a first electronic component, a second substrate and a second electronic component. The first substrate includes a first patterned circuit layer. The first electronic component is disposed over and electrically connected to the first patterned circuit layer of the first substrate. The second substrate is disposed over the first electronic component, and includes a second patterned circuit layer. The second electronic component is disposed over and electrically connected to the second patterned circuit layer of the second substrate. An outer extending portion of the second patterned circuit layer extends along a lateral surface of the first electronic component.

Another aspect of the present disclosure provides a method of manufacturing a package structure. The method includes: providing a first assembly structure including a first substrate and a first electronic component electrically connected to a first patterned circuit layer of the first substrate; providing a second assembly structure including a second substrate and a second electronic component electrically connected to a second patterned circuit layer of the second substrate, wherein an outer extending portion of the second patterned circuit layer extends to a position outside a lateral surface of the second substrate; attaching the second assembly structure to the first assembly structure; and pressing an end of the outer extending portion of the second patterned circuit layer to connect the first patterned circuit layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package structure, comprising:
a first substrate including a first patterned circuit layer and defining a first through hole;
a first electronic component disposed over the first through hole of the first substrate, wherein the first electronic component is electrically connected to the first patterned circuit layer of the first substrate through an extending portion of the first patterned circuit layer extending beyond a sidewall of the first through hole;
a second substrate including a second patterned circuit layer and defining a second through hole;
a second electronic component disposed over the second through hole of the second substrate, wherein the second electronic component is electrically connected to the second patterned circuit layer of the second substrate through an inner extending portion of the second patterned circuit layer extending beyond a sidewall of the second through hole; and
at least one external connector disposed adjacent to a second surface of the first substrate, and electrically connected to the first patterned circuit layer through at least one through via in the first substrate.

2. The package structure of claim 1, wherein the first substrate has a first surface and a second surface opposite to the first surface, and the first electronic component is attached to the first surface of the first substrate.

3. The package structure of claim 2, wherein a first active surface of the first electronic component has a first portion and a second portion, the first portion of the first active surface of the first electronic component is exposed in the first through hole of the first substrate, and the second portion of the first active surface of the first electronic component is adhered to the first surface of the first substrate through a first adhesion layer.

4. The package structure of claim 3, wherein the second portion of the first active surface of the first electronic component surrounds the first portion of the first active surface of the first electronic component.

5. The package structure of claim 2, wherein the first patterned circuit layer is disposed adjacent to the first surface of the first substrate.

6. The package structure of claim 1, wherein the first electronic component includes at least one first bump disposed adjacent to a first active surface thereof, and the extending portion of the first patterned circuit layer is connected to the at least one first bump of the first electronic component.

7. The package structure of claim 1, further comprising:
a package body disposed in the first through hole of the first substrate and encapsulating the extending portion of the first patterned circuit layer, wherein the package body contacts a first active surface of the first electronic component.

8. The package structure of claim 7, wherein the package body is further disposed on the first surface of the first substrate and encapsulating the first electronic component and the second electronic component.

9. The package structure of claim 1, wherein the extending portion of the first patterned circuit layer and the first patterned circuit layer are at the same layer.

10. The package structure of claim 1, wherein the first patterned circuit layer is formed from a metal foil.

* * * * *